US012684981B2

(12) United States Patent
Lee et al.

(10) Patent No.: US 12,684,981 B2
(45) Date of Patent: Jul. 14, 2026

(54) DISPLAY DEVICE

(71) Applicant: Samsung Display Co., Ltd., Yongin-si (KR)

(72) Inventors: Joongu Lee, Seoul (KR); Hye Jin Gwark, Suwon-si (KR); Arong Kim, Hwaseong-si (KR); Jaeik Kim, Seoul (KR); Jungsun Park, Yongin-si (KR); Heemin Park, Hwaseong-si (KR); Duckjung Lee, Hwaseong-si (KR); Yeonhwa Lee, Hwaseong-si (KR); Kyu Hwan Hwang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 898 days.

(21) Appl. No.: 17/673,680

(22) Filed: Feb. 16, 2022

(65) Prior Publication Data

US 2022/0328582 A1 Oct. 13, 2022

(30) Foreign Application Priority Data

Apr. 12, 2021 (KR) ......................... 10-2021-0047104

(51) Int. Cl.
*H10K 59/35* (2023.01)
*H10K 50/818* (2023.01)
(Continued)

(52) U.S. Cl.
CPC ......... *H10K 59/353* (2023.02); *H10K 59/122* (2023.02); *H10K 59/80518* (2023.02); *H10K 59/8731* (2023.02)

(58) Field of Classification Search
CPC .. H10K 59/352; H10K 59/123; H10K 59/124; H10K 59/8731; H10K 59/121;
(Continued)

(56) References Cited

U.S. PATENT DOCUMENTS 9,825,109 B2 11/2017 Morita et al.
11,043,649 B2 * 6/2021 Yang ...................... H10K 50/19
(Continued)

FOREIGN PATENT DOCUMENTS

KR 10-2004-0066721 A 7/2004
KR 10-2014-0097867 A 8/2014
(Continued)

*Primary Examiner* — Vongsavanh Sengdara
(74) *Attorney, Agent, or Firm* — Womble Bond Dickinson (US) LLP

(57) ABSTRACT

A display device includes a base layer, a circuit layer on the base layer, and a plurality of light emitting units on the circuit layer. Each of the light emitting units includes a lower electrode, a pixel definition layer on the lower electrode, the pixel definition layer having a pixel opening to expose the lower electrode, a functional layer on the lower electrode, the functional layer including a light emitting layer, an upper electrode on the functional layer, and an encapsulation layer on the upper electrode. At least one light emitting unit from among the plurality of light emitting units is at a different layer from other light emitting units from among the plurality of light emitting units in a thickness direction, and the pixel openings of the plurality of light emitting units do not overlap each other.

24 Claims, 15 Drawing Sheets

(51) Int. Cl.
    *H10K 50/844*     (2023.01)
    *H10K 59/122*     (2023.01)
    *H10K 59/80*     (2023.01)

(58) Field of Classification Search
    CPC ........... H10K 59/122; H10K 59/80518; H10K
                     50/844; H10K 50/818
    See application file for complete search history.

(56)               References Cited

U.S. PATENT DOCUMENTS

| | | |
|---|---|---|
| 2004/0140757 A1 | 7/2004 | Tyan et al. |
| 2009/0091238 A1 * | 4/2009 | Cok ........................ H10K 59/38 |
| | | 313/498 |
| 2014/0319475 A1 * | 10/2014 | Joo ...................... H10K 59/122 |
| | | 438/34 |
| 2017/0025482 A1 * | 1/2017 | Choi .................. H10K 59/8792 |
| 2017/0162643 A1 * | 6/2017 | Yang ...................... H10K 59/35 |
| 2019/0296264 A1 * | 9/2019 | Mathai ................... H10K 50/15 |
| 2020/0287162 A1 * | 9/2020 | Chung ................. H10W 90/00 |
| 2021/0327966 A1 * | 10/2021 | Wang .................... H10K 59/32 |

FOREIGN PATENT DOCUMENTS

| | | |
|---|---|---|
| KR | 10-1695082 B1 | 1/2017 |
| KR | 10-1828808 B1 | 2/2018 |
| KR | 10-2019-0123829 A | 11/2019 |

* cited by examiner

Figure 11:
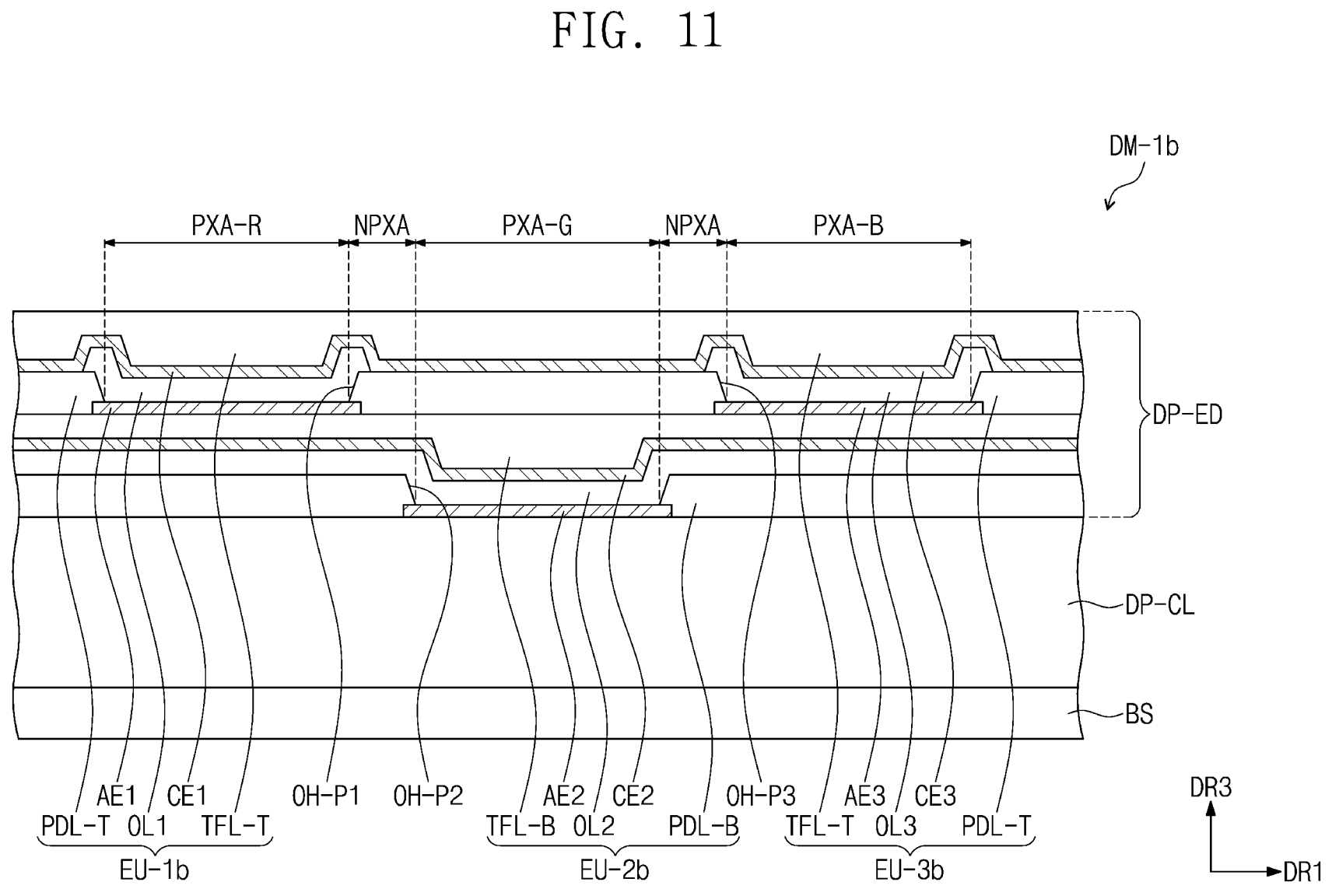

PXA-B

NPXA

PXA-G

NPXA

PXA-R

OH-P3

OH-P2

OH-P1

PDL-T
CE3
AE3  CE3
OL3
TFL-T  OL3  PDL-T
EU-3b

PDL-B
CE2
AE2  CE2
OL2
TFL-B  OL2
EU-2b

AE1  CE1  TFL-T
OL1
AE-T  OL1
PDL-T
EU-1b

DISPLAY DEVICE

CROSS-REFERENCE TO RELATED APPLICATION

This application claims priority to and the benefit of Korean Patent Application No. 10-2021-0047104 filed on Apr. 12, 2021 in the Korean Intellectual Property Office (KIPO), the entire content of which is incorporated by reference herein.

BACKGROUND

1. Field

The present disclosure relates to a display device. For example, the present disclosure relates to a display device including a plurality of light emitting units stacked one on another.

2. Description of the Related Art

Various display devices are being used to provide image information, and a patterning process is performed to form respective pixels that provide red light, green light, and blue light to implement the image information when the display device is manufactured.

Meanwhile, in order to implement high-resolution image information on the display device, it is desirable to reduce a size of a non-light-emitting area and to increase the number of light emitting areas and a size of the light emitting area of each pixel providing the red light, the green light, or the blue light. In the process of patterning the pixels, there is a limit to reducing the non-light-emitting area between the light emitting areas due to the limitation of a patterning apparatus or patterning equipment, and thus, developments relating to a pixel structure and a manufacturing process of the display device may be desirable for implementing a high-resolution display device.

SUMMARY

Aspects of one or more embodiments of the present disclosure are directed toward a display device with a high resolution.

Aspects of one or more embodiments of the present disclosure are directed toward a display device including a light emitting area with increased size.

Embodiments of the present disclosure provide a display device including a base layer, a circuit layer on the base layer, and a plurality of light emitting units on the circuit layer. Each of the light emitting units includes a lower electrode, a pixel definition layer on the lower electrode, the pixel definition layer having a pixel opening to expose the lower electrode, a functional layer on the lower electrode, the functional layer including a light emitting layer, an upper electrode on the functional layer, and an encapsulation layer on the upper electrode. At least one light emitting unit from among the light emitting units is at a different layer from other light emitting units from among the plurality of light emitting units in a thickness direction, and the pixel openings of the plurality of light emitting units do not overlap each other.

The plurality of light emitting units include first, second, and third light emitting units configured to emit light in different wavelength regions, and a light emitting unit from among the first, second, and third light emitting units is at a different layer from other light emitting units from among the first, second, and third light emitting units in the thickness direction.

The first light emitting unit is configured to emit red light, the second light emitting unit is configured to emit green light, the third light emitting unit is configured to emit blue light, and the first light emitting unit, the second light emitting unit, and the third light emitting unit are sequentially stacked on the circuit layer.

The circuit layer includes first, second, and third transistors on the base layer and spaced from each other, and the first, second, and third light emitting units are electrically connected to the first, second, and third transistors, respectively.

The circuit layer further includes a contact electrode electrically connecting the first, second, and third light emitting units to the first, second, and third transistors, respectively.

The display device includes first, second, and third light emitting areas to emit light in different wavelength regions and a non-light-emitting area between adjacent ones of the first, second, and third light emitting areas, and the pixel openings of the first, second, and third light emitting units correspond to the first, second, and third light emitting areas, respectively.

The first light emitting unit includes a first lower electrode, a first pixel definition layer having a first pixel opening to expose an upper surface of the first lower electrode, a first functional layer on the first lower electrode, a first upper electrode on the first functional layer, and a first encapsulation layer on the first upper electrode. The second light emitting unit includes a second lower electrode that does not overlap the first lower electrode, a second pixel definition layer having a second pixel opening to expose an upper surface of the second lower electrode, the second pixel opening not overlapping the first pixel opening, a second functional layer on the second lower electrode, a second upper electrode on the second functional layer, and a second encapsulation layer on the second upper electrode. The third light emitting unit includes a third lower electrode that does not overlap the first lower electrode and the second lower electrode, a third pixel definition layer having a third pixel opening to expose an upper surface of the third lower electrode, the third pixel opening not overlapping the first pixel opening and the second pixel opening, a third functional layer on the third lower electrode, a third upper electrode on the third functional layer, and a third encapsulation layer on the third upper electrode.

The first light emitting unit, the second light emitting unit, and the third light emitting unit are sequentially stacked on the circuit layer, a first opening is defined through the first light emitting unit, a second opening is defined through the first and second light emitting units, the second lower electrode is electrically connected to the circuit layer in the first opening, and the third lower electrode is electrically connected to the circuit layer in the second opening.

The first light emitting unit, the second light emitting unit, and the third light emitting unit are sequentially stacked on the circuit layer, a first opening is defined through the first light emitting unit in an area corresponding to a first non-light-emitting area between the first light emitting area and the second light emitting area, and a second opening is defined through the first and second light emitting units in an area corresponding to a second non-light-emitting area between the second light emitting area and the third light emitting area.

The second lower electrode, the second pixel definition layer, the second functional layer, the second upper electrode, and the second encapsulation layer extend to the first opening and are in the first opening, and the third lower electrode, the third pixel definition layer, the third functional layer, the third upper electrode, and the third encapsulation layer extend to the second opening and are in the second opening.

An exposed side surface of the first functional layer is spaced from a side surface of the first opening, and the exposed side surface of the first functional layer and an exposed side surface of the second functional layer are spaced from a side surface of the second opening.

The exposed side surface of the first functional layer is covered by the first encapsulation layer, and the exposed side surface of the second functional layer is covered by the second encapsulation layer.

The first functional layer does not overlap the second functional layer, and the third functional layer overlaps the first functional layer and the second functional layer.

The first functional layer does not overlap the third functional layer, and the second functional layer overlaps the first functional layer and the third functional layer.

The pixel definition layer of the other light emitting units, except a light emitting unit disposed at a lowermost position from among the light emitting units, includes at least one of silicon oxide and silicon nitride.

The encapsulation layer includes at least one inorganic layer.

The encapsulation layer includes a first inorganic layer, an organic layer, and a second inorganic layer, which are sequentially stacked.

Embodiments of the present disclosure provide a display device including a base layer, a circuit layer on the base layer, and first, second, and third light emitting units on the circuit layer. The first light emitting unit includes a first lower electrode, a first pixel definition layer having a first pixel opening to expose the first lower electrode, a first functional layer on the first pixel definition layer, a first upper electrode on the first functional layer, and a first encapsulation layer on the first upper electrode. The second light emitting unit includes a second lower electrode on the first encapsulation layer, a second pixel definition layer on the second lower electrode, the second pixel definition layer having a second pixel opening to expose the second lower electrode, the second pixel opening not overlapping the first pixel opening, a second functional layer on the second pixel definition layer, a second upper electrode on the second functional layer, and a second encapsulation layer on the second upper electrode. The third light emitting unit includes a third lower electrode on the second encapsulation layer, a third pixel definition layer on the third lower electrode, the third pixel definition layer having a third pixel opening to expose the third lower electrode, the third pixel opening not overlapping the first pixel opening and the second pixel opening, a third functional layer on the third pixel definition layer, a third upper electrode on the third functional layer, and a third encapsulation layer on the third upper electrode.

The circuit layer includes first, second, and third transistors configured to be independently driven, and the first, second, and third transistors are electrically connected to the first, second, and third light emitting units, respectively.

A first opening is defined through the first light emitting unit, the first opening not overlapping the first pixel opening, the second lower electrode is electrically connected to the circuit layer in the first opening, a second opening is defined through the first and second light emitting units, the second opening not overlapping the first pixel opening, the second pixel opening, and the first opening, and the third lower electrode is electrically connected to the circuit layer in the second opening.

The second pixel definition layer and the third pixel definition layer include at least one of silicon oxide and silicon nitride.

Each of the first lower electrode, the second lower electrode, and the third lower electrode is a reflective electrode, and each of the first upper electrode, the second upper electrode, and the third upper electrode is a transmissive electrode.

Embodiments of the present disclosure provide a display device including first, second, and third light emitting areas to emit light in different wavelength regions from each other in a plan view. The display device includes a base layer, a circuit layer on the base layer, and first, second, and third light emitting units on the circuit layer. Each of the first, second, and third light emitting units includes a lower electrode, a pixel definition layer having pixel openings respectively corresponding to the first, second, and third light emitting areas, the pixel openings exposing an upper surface of the lower electrode, a functional layer on the lower electrode, the functional layer including a light emitting layer, an upper electrode on the functional layer, and an encapsulation layer on the upper electrode. At least one functional layer from among the functional layers of the first, second, and third light emitting units is at a different layer from other functional layers of the first, second, and third light emitting units in a thickness direction.

The first light emitting unit is configured to emit red light, the second light emitting unit is configured to emit green light, the third light emitting unit is configured to emit blue light, the first light emitting unit is on the circuit layer, the second light emitting unit is on the first light emitting unit, and the third light emitting unit is on the second light emitting unit.

According to the above, as the display device includes the light emitting units stacked in the thickness direction, a distance between the light emitting units different from each other is reduced when viewed in a plan view, and the display device with high resolution is provided.

In addition, the display device includes the light emitting units that are stacked vertically and emit lights with different wavelength regions. Accordingly, the size of the non-light-emitting area is reduced, and thus, the size of the light emitting areas increases.

BRIEF DESCRIPTION OF THE DRAWINGS

The above and other aspects of the present disclosure will become readily apparent by reference to the following detailed description when considered in conjunction with the accompanying drawings wherein:

FIG. 9 is a cross-sectional view showing a display module according to an embodiment of the present disclosure;

FIG. 10 is a cross-sectional view showing a display module according to an embodiment of the present disclosure;

FIG. 11 is a cross-sectional view showing a display module according to an embodiment of the present disclosure;

FIG. 13 is a cross-sectional view showing a display module according to an embodiment of the present disclosure;

DETAILED DESCRIPTION

Figure 1:
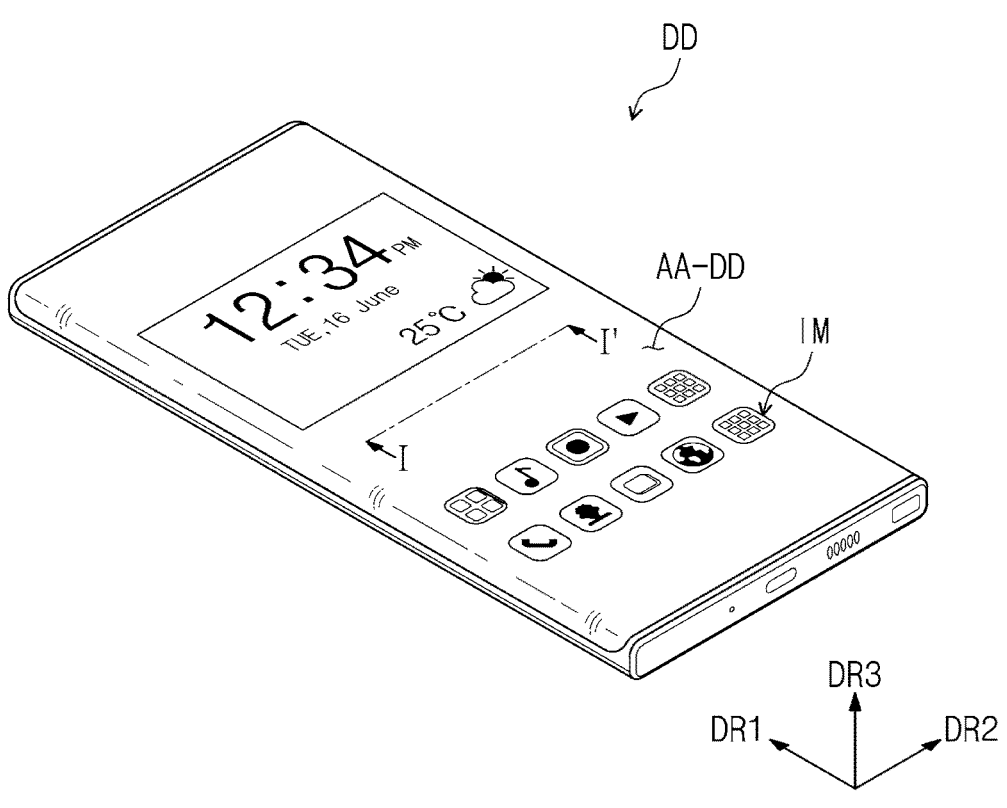
FIG. 1 is a perspective view showing a display device according to an embodiment of the present disclosure.

Embodiments of the present disclosure may be variously modified and realized in many different forms, and thus one or more embodiments are shown in the drawings and described in more detail hereinbelow. However, the present disclosure should not be limited to the embodiments shown in the drawings and described in more detail hereinbelow. Rather, the present disclosure should be construed to include all modifications, equivalents, or replacements included in the spirit and scope of the present disclosure.

The terminology used herein is for the purpose of describing particular example embodiments only and is not intended to limit the example embodiments described herein.

As used herein, expressions such as "at least one of," "one of," and "selected from," when preceding a list of elements, modify the entire list of elements and do not modify the individual elements of the list.

Further, the use of "may" when describing embodiments of the present disclosure refers to "one or more embodiments of the present disclosure".

It will be understood that when an element (e.g., an area, a layer, or a portion) is referred to as being "on", "connected to" or "coupled to" another element or layer, it can be directly on, directly connected, or directly coupled to the other element or one or more intervening elements may be present.

In contrast, when an element is referred to as being "directly on," "directly connected to" or "directly coupled to" another element, there are no intervening elements present. As used herein, the term "and/or" includes any and all combinations of one or more of the associated listed items.

In the present disclosure, the expression "directly disposed" refers to no intervening element (e.g., a layer, a film, or a plate) being present between the element and other element. In other words, the expression "directly disposed" refers to two layers or two members being disposed with no additional member such as an adhesive member therebetween.

Like numerals refer to like elements throughout, and duplicative descriptions thereof may not be provided. In the drawings, the thickness, ratio, and dimension of components may be exaggerated for clarity. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein, including technical or scientific terms, have the same meanings as those generally understood by those skilled in the art to which the present disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the present disclosure will be explained in more detail with reference to the accompanying drawings.

Figure 2:
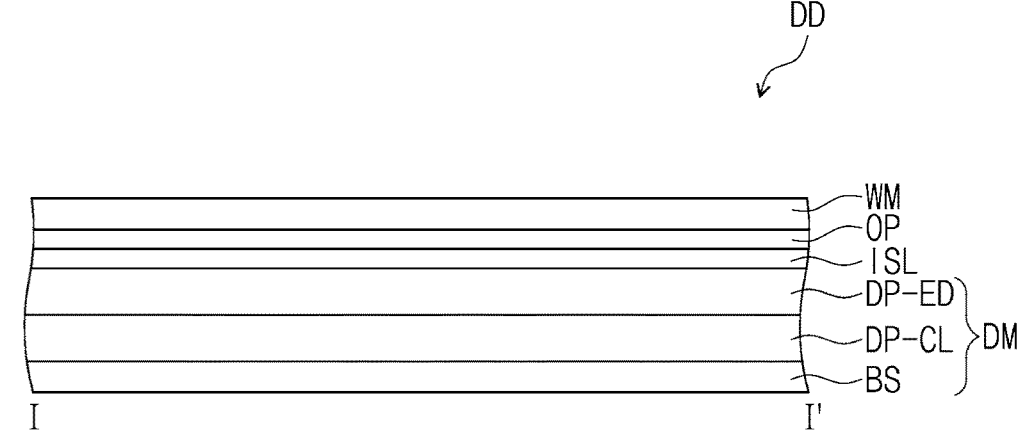
FIG. 2 is a cross-sectional view showing a display device according to an embodiment of the present disclosure.
Figure 3:
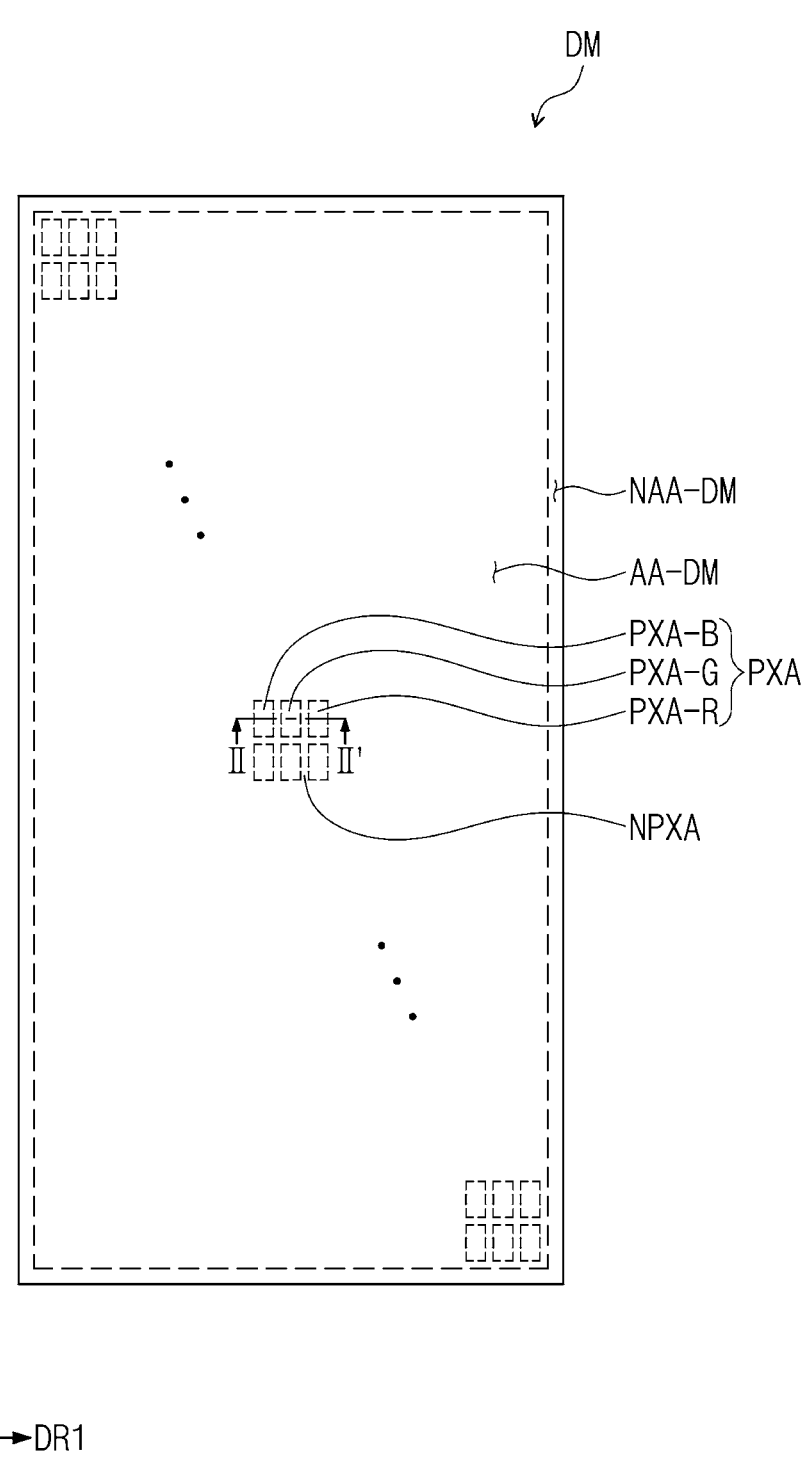
FIG. 3 is a plan view showing a display module according to an embodiment of the present disclosure.
Figure 4:
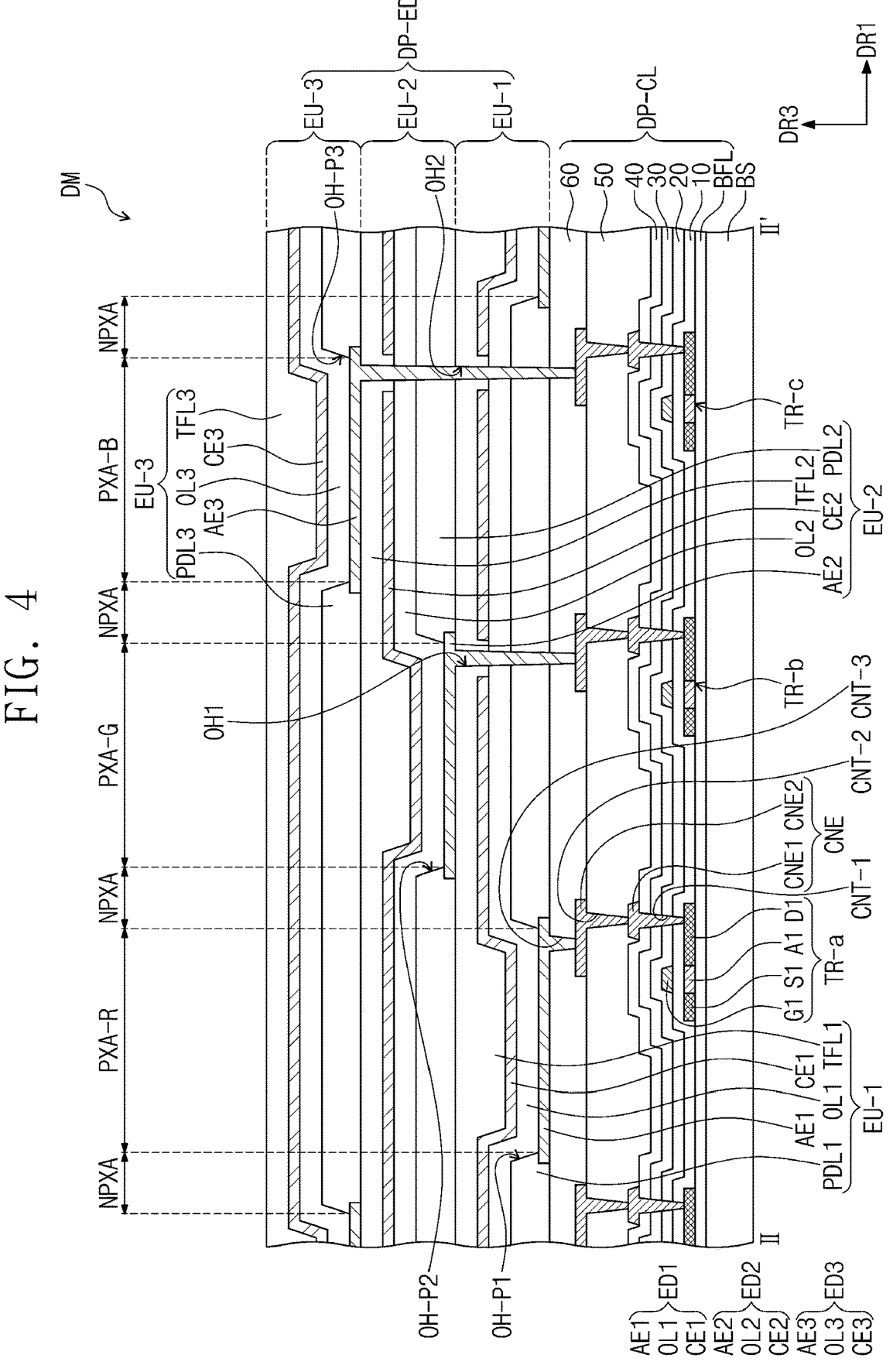
FIG. 4 is a cross-sectional view showing a display module according to an embodiment of the present disclosure.

FIG. 1 is a perspective view showing a display device DD according to an embodiment of the present disclosure. FIG. 2 is a cross-sectional view showing the display device DD according to an embodiment of the present disclosure. FIG. 2 is a cross-sectional view taken along the line I-I' of FIG. 1. FIG. 3 is a plan view showing a display module DM according to an embodiment of the present disclosure. FIG. 4 is a cross-sectional view showing the display module DM according to an embodiment of the present disclosure. FIG. 4 is a cross-sectional view taken along the line II-II' of FIG. 3.

The display device DD may be a device activated in response to electrical signals. For example, the display device DD may be a mobile phone, a tablet computer, a car navigation unit, a game unit, or a wearable device, however, it should not be limited thereto or thereby. FIG. 1 shows the mobile phone as a representative example of the display device DD.

The display device DD may display an image IM through an active area AA-DD. The active area AA-DD may include a plane (e.g., a planar surface) defined by a first directional axis DR1 and a second directional axis DR2. The active area AA-DD may further include a curved surface bent from at least one side of the plane (e.g., the planar surface) defined by the first directional axis DR1 and the second directional axis DR2. The display device DD shown in FIG. 1 includes two curved surfaces respectively bent from opposite sides of the plane (e.g., the planar surface) defined by the first directional axis DR1 and the second directional axis DR2. However, the shape of the active area AA-DD should not be limited thereto or thereby. For example, the active area AA-DD may include only the plane (e.g., the planar surface), or the active area AA-DD may further include two or more curved surfaces (e.g., four curved surfaces respectively bent from four sides of the plane).

Meanwhile, FIG. 1 and the following drawings show the first, second, and third directional axes DR1, DR2, and DR3, and directions indicated by the first, second, and third directional axes DR1, DR2, and DR3 may be spatially relative to each other and may be changed to other directions. In addition, the directions indicated by the first, second, and third directional axes DR1, DR2, and DR3 may be referred to as first, second, and third directions, respectively, and may be assigned the same reference numerals as those of the first, second, and third directional axes DR1, DR2, and DR3, respectively.

In the following descriptions, the first directional axis DR1 may be perpendicular or substantially perpendicular to the second directional axis DR2, and the third directional axis DR3 may be normal to a plane defined by the first directional axis DR1 and the second directional axis DR2. In other words, the third directional axis DR3 may be perpendicular or substantially perpendicular to the first directional axis DR1 and the second directional axis DR2.

According to an embodiment, the display device DD may include the display module DM, an optical layer OP disposed on the display module DM, and a window WM disposed on the optical layer OP. In addition, according to an embodiment, the display device DD may include a sensor layer ISL disposed on the display module DM. The display module DM may include a base layer BS, a circuit layer DP-CL disposed on the base layer BS, and a display element layer DP-ED disposed on the circuit layer DP-CL.

The base layer BS may be a member that provides a base surface on which the display element layer DP-ED is disposed. For example, the display element layer DP-ED may be disposed on the base layer BS with the circuit layer DP-CL therebetween. The base layer BS may be a glass substrate, a metal substrate, and/or a polymer substrate. However, the present disclosure should not be limited thereto or thereby. For example, the base layer BS may be an inorganic layer, a functional layer, and/or a composite material layer.

The base layer BS may have a multi-layer structure. For instance, the base layer BS may have a three-layer structure of a polymer resin layer, an adhesive layer, and a polymer resin layer. The polymer resin layer may include a polyimide-based resin. In addition, the polymer resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. In the present disclosure, the term "X-based resin", as used herein, refers to the resin that includes a functional group of X.

The circuit layer DP-CL may be disposed on the base layer BS. The circuit layer DP-CL may include an insulating layer, a semiconductor pattern, a conductive pattern, and a signal line. An insulating layer, a semiconductor layer, and a conductive layer may be formed on the base layer BS by a coating process, a deposition process (e.g., a vapor deposition process), or the like. Then, the insulating layer, the semiconductor layer, and the conductive layer may be selectively patterned through several photolithography processes. Thereafter, the semiconductor pattern, the conductive pattern, and the signal line included in the circuit layer DP-CL may be formed. The circuit layer DP-CL may be connected (e.g., electrically connected) to light emitting units EU-1, EU-2, and EU-3 described later. As an example, lower electrodes AE1, AE2, and AE3 and upper electrodes CE1, CE2, and CE3 of the light emitting units EU-1, EU-2, and EU-3 may be connected (e.g., electrically connected) to the circuit layer DP-CL via contact holes defined through the light emitting units EU-1, EU-2, and EU-3.

The display element layer DP-ED may be disposed on the circuit layer DP-CL. The display element layer DP-ED may include light emitting elements ED1, ED2, and ED3. The display element layer DP-ED may include the light emitting units EU-1, EU-2, and EU-3 including the light emitting elements ED1, ED2, and ED3. Meanwhile, the display element layer DP-ED may include an organic light emitting element or a quantum dot light emitting element as the light emitting elements ED1, ED2, and ED3.

The sensor layer ISL may be disposed on the display element layer DP-ED. The sensor layer ISL may sense an external input applied thereto from the outside. For example, the external input may be a user input. The user input may include a variety of external inputs such as a part of a user's body, a pen (e.g., an active pen), a stylus, and/or the like. In one or more embodiments, the user input may include external inputs such as light, heat, pressure, and/or the like.

The sensor layer ISL may be formed on the display element layer DP-ED through successive processes. In this case, it may be expressed that the sensor layer ISL is disposed directly on the display element layer DP-ED. The expression that the sensor layer ISL is disposed directly on the display element layer DP-ED refers to no intervening elements being present between the sensor layer ISL and the display element layer DP-ED. That is, a separate adhesive member may not be disposed between the sensor layer ISL and the display element layer DP-ED. However, the present disclosure should not be limited thereto or thereby. For example, an adhesive member may further be disposed between the sensor layer ISL and the display element layer DP-ED.

The optical layer OP may be disposed on the sensor layer ISL. The optical layer OP may include at least one of optical functional layers, such as an optical path control layer that changes an optical path, an anti-reflective layer that reduces a reflectance of an external light, and the like. As an example, the optical layer OP of the display device DD may be a polarizing plate or a color filter layer.

The window WM may be disposed on the optical layer OP. The window WM may be an uppermost layer of the display device DD. The window WM may be a tempered glass substrate. The window WM may include a reinforced surface and may stably protect the sensor layer ISL and the display module DM from external impacts. According to an embodiment, the window WM may further include a printed layer disposed at an inner or outer edge thereof. As an example, the printed layer may be a portion provided to correspond to a peripheral area NAA-DM. An adhesive member may be further disposed between the window WM and the optical layer OP. The adhesive member may include an optically clear adhesive layer.

The display module DM may include an active area AA-DM and the peripheral area NAA-DM neighboring the active area AA-DM. The active area AA-DM may be activated in response to electrical signals. The peripheral area NAA-DM may surround the active area AA-DM. A driving circuit or a driving line to drive the active area AA-DM, various signal lines or pads to apply electrical signals to the active area AA-DM, and/or electronic elements may be disposed in the peripheral area NAA-DM.

According to an embodiment, the display device DD may include the display module DM including a plurality of light emitting areas PXA. The light emitting areas PXA may not overlap each other and may be distinguished from each other when viewed in a plane or in a plan view. In the present disclosure, the expression "when viewed in a plane" or "in a plane" may refer to a state of being viewed in the third directional axis DR3. As an example, referring to FIG. 3, light emitting areas PXA-R, PXA-G, and PXA-B may be spaced from each other when viewed in a plane or a plan view defined by the first directional axis DR1 and the second directional axis DR2. A portion between the light emitting areas PXA may correspond to the non-light-emitting area NPXA.

Referring to FIGS. 3 and 4, the light emitting areas PXA may include a first light emitting area PXA-R, a second light emitting area PXA-G, and a third light emitting area PXA-B respectively corresponding to the light emitting units EU-1, EU-2, and EU-3. The first, second, and third light emitting areas PXA-R, PXA-G, and PXA-B may be areas from which lights respectively generated by the light emitting units EU-1, EU-2, and EU-3 are emitted. The first, second, and third light emitting areas PXA-R, PXA-G, and PXA-B may be areas corresponding to pixel openings OH-P1, OH-P2, and OH-P3 in the light emitting units EU-1, EU-2, and EU-3, respectively.

The first, second, and third light emitting areas PXA-R, PXA-G, and PXA-B may be distinguished from each other without overlapping each other when viewed in a plane or in a plan view. As an example, the non-light-emitting area NPXA may be disposed between the light emitting areas PXA-R, PXA-G, and PXA-B adjacent to each other. In other words, the non-light-emitting area NPXA may be disposed between adjacent ones of the light emitting areas PXA-R, PXA-G, and PXA-B in a plan view.

According to an embodiment, because the light emitting units included in the display device DD are stacked in a thickness direction (e.g., a thickness direction of the display device DD), a size of the non-light-emitting area NPXA or a width of the non-light-emitting area disposed between the light emitting areas may be reduced compared with a related art display device.

The first, second, and third light emitting areas PXA-R, PXA-G, and PXA-B may not overlap each other. Meanwhile, the first, second, and third light emitting areas PXA-R, PXA-G, and PXA-B may not overlap adjacent light emitting areas, and the size of the non-light-emitting area NPXA may be smaller (e.g., relatively much smaller) than a size of the light emitting area within a range in which the first, second, and third light emitting areas PXA-R, PXA-G, and PXA-B are distinguished from each other. As an example, the size of the non-light-emitting area disposed between the light emitting areas adjacent to each other may be small (e.g., relatively very small) within a range in which the first, second, and third light emitting areas PXA-R, PXA-G, and PXA-B adjacent to each other do not overlap each other or the non-light-emitting area may be omitted. In other words, non-light-emitting area may not be present or the size of the non-light-emitting area may be relatively small.

According to an embodiment, the display device DD may include the display module DM including the base layer BS, the circuit layer DP-CL disposed on the base layer BS, and the light emitting units EU-1, EU-2, and EU-3 disposed on the circuit layer DP-CL. At least one light emitting unit from among the light emitting units EU-1, EU-2, and EU-3 may be disposed on or at a different layer from the other light emitting units from among the light emitting units EU-1, EU-2, and EU-3 in the thickness direction. That is, at least one light emitting unit from among the light emitting units EU-1, EU-2, and EU-3 may be disposed on or at a different plane from the other light emitting units from among the light emitting units EU-1, EU-2, and EU-3 in the thickness direction. As an example, the light emitting units EU-1, EU-2, and EU-3 may be respectively disposed on or at different planes in the thickness direction, or one or two light emitting units from among the light emitting units EU-1, EU-2, and EU-3 may be disposed on or at the same plane, and the other light emitting unit(s) may be disposed on or at a different plane from the one or two light emitting units in the thickness direction.

According to an embodiment, the display element layer DP-ED disposed on the circuit layer DP-CL may include the light emitting units EU-1, EU-2, and EU-3 stacked in the third directional axis DR3 (e.g., the thickness direction). The light emitting units EU-1, EU-2, and EU-3 may respectively include the lower electrodes AE1, AE2, and AE3, pixel definition layers PDL1, PDL2, and PDL3, functional layers OL1, OL2, and OL3, the upper electrodes CE1, CE2, and CE3, and encapsulation layers TFL1, TFL2, and TFL3.

Referring to FIG. 4, the display element layer DP-ED of the display module DM may include the first, second, and third light emitting units EU-1, EU-2, and EU-3. The display element layer DP-ED may include the first light emitting unit EU-1, the second light emitting unit EU-2 disposed on the first light emitting unit EU-1, and the third light emitting unit EU-3 disposed on the second light emitting unit EU-2. In addition, according to an embodiment, a second functional layer OL2 of the second light emitting unit EU-2 may be disposed on a first functional layer OL1 of the first light emitting unit EU-1, and a third functional layer OL3 of the third light emitting unit EU-3 may be disposed on the second functional layer OL2 of the second light emitting unit EU-2.

The first, second, and third light emitting units EU-1, EU-2, and EU-3 may emit light in different wavelength regions from each other. As an example, in the embodiment shown in FIG. 4, the first light emitting unit EU-1 may emit red light, the second light emitting unit EU-2 may emit green light, and the third light emitting unit EU-3 may emit blue light, however, the present disclosure should not be limited thereto or thereby. For example, a light emitting unit that emits light having a different wavelength may be further included in addition to the light emitting units emitting the red light, the green light, and the blue light, or a wavelength region of emitted light may correspond to a wavelength region of light other than the red light, the green light, and the blue light. In one or more embodiments, the first, second, and third light emitting units EU-1, EU-2, and EU-3 may emit light other than the red light, the green light, and/or the blue light.

In addition, a stacking order of the light emitting units EU-1, EU-2, and EU-3 emitting the light in different wavelength regions from each other may be different from that shown in FIG. 4. As an example, the light emitting unit emitting the green light may be disposed at a lowermost position (e.g., a lowermost position from among the positions of the light emitting units EU-1, EU-2, and EU-3), and the light emitting units emitting the red light and the blue light may be disposed at positions higher than the lowermost position at which the light emitting unit emitting the green light is disposed. Different from the above, the light emitting unit emitting the blue light may be disposed at a lowermost position, and the light emitting units emitting the red light and the green light may be disposed at positions higher than the lowermost position at which the light emitting unit emitting the blue light is disposed.

Meanwhile, a light absorbing layer or a light blocking layer may be further disposed between the light emitting unit (hereinafter, referred to as an upper light emitting unit) disposed at an upper portion and the light emitting unit (hereinafter, referred to as a lower light emitting unit) disposed at a lower portion in an area corresponding to the light emitting area of the upper light emitting unit to minimize or reduce an influence of the light emitted from the lower light emitting unit to the upper light emitting unit. For example, in a case where the light emitting unit that emits a light in a relatively short wavelength region is disposed at the lower portion, a light absorbing layer or a light blocking layer may be further disposed under the upper light emitting unit disposed in an area corresponding to the pixel opening of the upper light emitting unit to prevent or substantially prevent the upper light emitting unit from being excited by the light (e.g., light from the light emitting unit disposed at the lower portion) in the short wavelength region with high energy and thereby emitting light (e.g., emitting light from the upper light emitting unit).

The light emitting units EU-1, EU-2, and EU-3 may respectively include the light emitting elements ED1, ED2, and ED3 including the lower electrodes AE1, AE2, and AE3, the functional layers OL1, OL2, and OL3, and the upper electrodes CE1, CE2, and CE3. As shown in FIG. 4, the functional layers OL1, OL2, and OL3 of the light emitting elements ED1, ED2, and ED3 may be disposed at different planes from each other. The light emitting elements ED1, ED2, and ED3 may emit light in different wavelength regions from each other.

Figure 5:
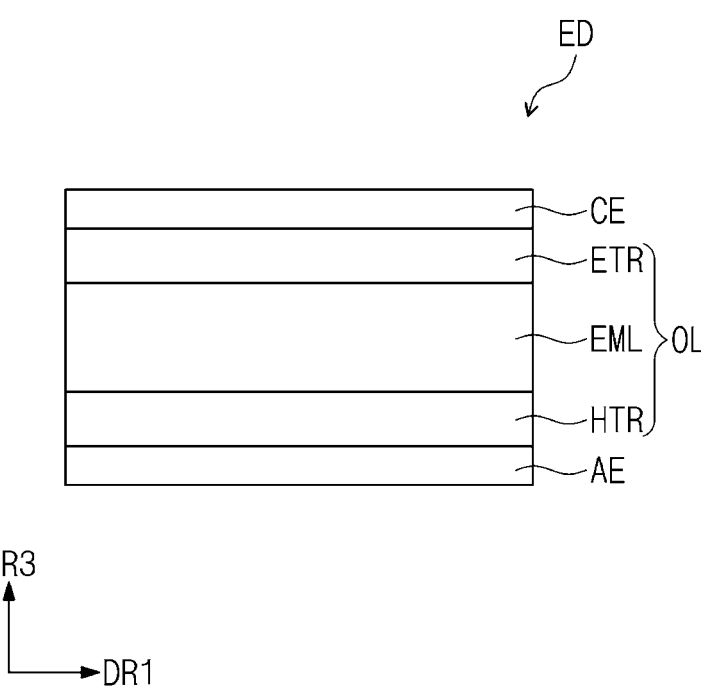
FIG. 5 is a cross-sectional view showing a light emitting element according to an embodiment of the present disclosure.

FIG. 5 shows a light emitting element ED according to an embodiment. The light emitting element ED shown in FIG. 5 is a representative example of the light emitting elements ED1, ED2, and ED3 respectively included in the light emitting units EU-1, EU-2, and EU-3 shown in FIG. 4, and light emitting units EU-1, EU-2, and EU-3 may have a difference in a configuration of a light emitting layer EML of the light emitting element ED.

The light emitting element ED may include a lower electrode AE, an upper electrode CE facing the lower electrode AE, and a functional layer OL disposed between the lower electrode AE and the upper electrode CE. The functional layer OL may include the light emitting layer EML, a hole transport region HTR, and an electron transport region ETR. The hole transport region HTR may be disposed between the light emitting layer EML and the lower electrode AE. The electron transport region ETR may be disposed between the light emitting layer EML and the upper electrode CE.

The functional layer OL, such as the hole transport region HTR, the light emitting layer EML, the electron transport region ETR, etc., may have a single-layer structure or a multi-layer structure. In addition, the functional layer OL may be formed using a vacuum deposition method, however, the present disclosure should not be limited thereto or thereby. According to an embodiment, the functional layer OL may be formed by various methods, such as a spin coating method, a cast method, an LB (Langmuir-Blodgett) method, an inkjet printing method, a laser printing method, an LITI (Laser Induced Thermal Imaging) method, etc.

The lower electrode AE may be an anode or a cathode. The lower electrode AE may be a pixel electrode. The lower electrode AE may be a transmissive electrode, a transflective electrode, or a reflective electrode. When the lower electrode AE is the transmissive electrode, the lower electrode AE may include a transparent metal oxide, for example, indium tin oxide (ITO), indium zinc oxide (IZO), zinc oxide (ZnO), and indium tin zinc oxide (ITZO). When the lower electrode AE is the transflective electrode or the reflective electrode, the lower electrode AE may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In addition, the lower electrode AE may have a multi-layer structure of the reflective layer or the transflective layer, which is formed of the above materials, and a transparent conductive layer formed of indium tin oxide (ITO), indium zinc oxide (IZO), zinc oxide (ZnO), indium tin zinc oxide (ITZO), etc. As an example, the lower electrode AE may have a three-layer structure of ITO/Ag/ITO, however, it should not be limited thereto or thereby.

The hole transport region HTR may be disposed between the lower electrode AE and the light emitting layer EML. The hole transport region HTR may include at least one of a hole injection layer, a hole transport layer, and an electron blocking layer.

The hole transport region HTR may include a phthalocyanine compound such as copper phthalocyanine, DNTPD ($N^1,N^{1'}$-([1,1'-biphenyl]-4,4'-diyl)bis($N^1$-phenyl-$N^4,N^4$-di-m-tolylbenzene-1,4-diamine)), m-MTDATA(4,4',4"-[tris(3-methylphenyl)phenylamino]triphenylamine), TDATA(4,4'4"-Tris(N,N-diphenylamino)triphenylamine), 2-TNATA (4,4',4"-tris[N-(2-naphthyl)-N-phenylamino]-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), PANI/PSS (Polyaniline/Poly(4-styrenesulfonate)), NPB(N,N'-di (naphthalene-1-yl)-N,N'-diphenyl-benzidine), poly(ether ketone)-containing triphenylamine(TPAPEK), 4-Isopropyl-4'-methyldiphenyliodonium [Tetrakis(pentafluorophenyl) borate], HATCN(dipyrazino[2,3-f: 2',3'-h] quinoxaline-2,3,6,7,10,11-hexacarbonitrile), etc.

The hole transport region HTR may include carbazole-based derivatives (e.g., n-phenyl carbazole, polyvinyl carbazole, etc.), fluorene-based derivatives, triphenylamine-based derivatives (e.g., TPD(N,N'-bis(3-methylphenyl)-N, N'-diphenyl-[1,1'-biphenyl]-4,4'-diamine), TCTA(4,4',4"-tris(N-carbazolyl)triphenylamine), etc.), NPB(N,N'-di (naphthalene-1-yl)-N,N'-diphenyl-benzidine), TAPC(4,4'-Cyclohexylidene bis[N,N-bis(4-methylphenyl) benzenamine]), HMTPD(4,4'-Bis[N,N'-(3-tolyl)amino]-3, 3'-dimethylbiphenyl), mCP(1,3-Bis(N-carbazolyl)benzene), etc.

The light emitting layer EML may be disposed on the hole transport region HTR. The light emitting layer EML may have a single-layer structure of a single material, a single-layer structure of plural different materials, or a multi-layer structure of layers formed of different materials.

The light emitting layer EML may include a fluorescent or phosphorescent material emitting red light, green light, or blue light. According to an embodiment, the light emitting layer EML of the light emitting element may include anthracene derivatives, pyrene derivatives, fluoranthene derivatives, chrysene derivatives, dihydrobenzanthracene derivatives, or triphenylene derivatives. In addition, the light emitting layer EML may include quantum dots as its light emitting material.

The electron transport region ETR may be disposed between the light emitting layer EML and the upper electrode CE. The electron transport region ETR may include at least one of an electron injection layer, an electron transport layer, and a hole blocking layer.

The electron transport region ETR may include, for example, Alq3(tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, TPBi(1,3,5-Tri(1-phenyl-1H-benzo[d]imidazol-2-yl)benzene), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), Bebq$_2$(berylliumbis(benzoquinolin-10-olate)), ADN(9,10-di(naphthalene-2-yl)anthracene), BmPyPhB(1,3-Bis[3,5-di(pyridin-3-yl)phenyl]benzene), and compounds thereof.

In addition, the electron transport region ETR may include a metal halide, such as LiF, NaCl, CsF, RbCl, RbI, CuI, KI, etc., a lanthanum group metal, such as Yb, or a co-deposition material of the metal halide and a lanthanum group. For example, the electron transport region ETR may include KI:Yb or RbI:Yb as the co-deposition material. Meanwhile, the electron transport region ETR may include a metal oxide, such as Li$_2$O or BaO, or Liq(8-hydroxyl-Lithium quinolate), however, the present disclosure should not be limited thereto or thereby. The electron transport region ETR may include a mixture of an electron transport material and an insulating organo metal salt.

The upper electrode CE may be disposed on the electron transport region ETR. The upper electrode CE may be a common electrode. The upper electrode CE may be a cathode or an anode, however, the present disclosure should not be limited thereto or thereby. As an example, when the lower electrode AE is the anode, the upper electrode CE may be the cathode, and when the lower electrode AE is the cathode, the upper electrode CE may be the anode.

The upper electrode CE may be a transmissive electrode, a transflective electrode, or a reflective electrode. When the upper electrode CE is the transmissive electrode, the upper electrode CE may include a transparent metal oxide, for example, indium tin oxide (ITO), indium zinc oxide (IZO), zinc oxide (ZnO), and indium tin zinc oxide (ITZO).

When the upper electrode CE is the transflective electrode or the reflective electrode, the upper electrode CE may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., a mixture of Ag and Mg, Ag and Yb, or Mg and Yb). In addition, the upper electrode CE may have a multi-layer structure of the reflective layer or the transflective layer, which is formed of the above materials, and a transparent conductive layer formed of indium tin oxide (ITO), indium zinc oxide (IZO), zinc oxide (ZnO), and/or indium tin zinc oxide (ITZO). As an example, the upper electrode CE may include the above-described metal materials, a combination of two or more metal materials selected from the above-described metal materials, or oxides of the above-described metal materials.

The light emitting element ED may have a front surface light emitting structure emitting a light toward the upper electrode CE or a rear surface light emission structure emitting a light toward the lower electrode AE according to a material combination of the lower electrode AE and the upper electrode CE.

In the embodiment shown in FIG. 4, each of a first lower electrode AE1, a second lower electrode AE2, and a third lower electrode AE3 may be the reflective electrode, and each of a first upper electrode CE1, a second upper electrode CE2, and a third upper electrode CE3 may be the transmissive electrode. In this case, the light emitting elements ED1, ED2, and ED3 may have a front surface light emission structure.

Different from the above, according to an embodiment, each of the first lower electrode AE1, the second lower electrode AE2, and the third lower electrode AE3 may be the transmissive electrode, and each of the first upper electrode CE1, the second upper electrode CE2, and the third upper electrode CE3 may be the reflective electrode. In this case, the light emitting elements ED1, ED2, and ED3 may have a rear surface light emission structure.

However, the present disclosure should not be limited thereto or thereby, and materials for the first lower electrode AE1, the second lower electrode AE2, and the third lower electrode AE3 and materials for the first upper electrode CE1, the second upper electrode CE2, and the third upper electrode CE3 may be combined in various suitable ways.

Referring to FIG. 4, the first, second, and third light emitting units EU-1, EU-2, and EU-3 may respectively include the pixel definition layers PDL1, PDL2, and PDL3 through which the pixel openings OH-P1, OH-P2, and OH-P3 are respectively defined to expose the lower electrodes AE1, AE2, and AE3. The pixel openings OH-P1, OH-P2, and OH-P3 of the first, second, and third light emitting units EU-1, EU-2, and EU-3 may not overlap each other.

According to an embodiment, each of the pixel definition layers PDL1, PDL2, and PDL3 of the display device may be an inorganic layer including at least one of the silicon oxide and the silicon nitride. In addition, different from the above, each of the pixel definition layers PDL1, PDL2, and PDL3 may be an organic layer formed of a polymer resin. As an example, the pixel definition layers PDL1, PDL2, and PDL3 may include a polyacrylate-based resin or a polyimide-based resin. In addition, the pixel definition layers PDL1, PDL2, and PDL3 may include both the polymer resin and the inorganic material.

Meanwhile, the pixel definition layers PDL1, PDL2, and PDL3 may include a light absorbing material or may include a black pigment or a black dye. The pixel definition layers PDL1, PDL2, and PDL3 including the black pigment or the black dye may be implemented as a black pixel definition layer. When the pixel definition layers PDL1, PDL2, and PDL3 are formed, a carbon black may be used as the black pigment or the black dye, however, it should not be limited thereto or thereby.

According to an embodiment, a first pixel definition layer PDL1, a second pixel definition layer PDL2, and a third pixel definition layer PDL3 may include at least one of silicon oxide and silicon nitride. In addition, according to an embodiment, the pixel definition layer of the light emitting units other than the pixel definition layer included in the light emitting unit disposed at a lowermost position may include at least one of silicon oxide and silicon nitride.

As an example, in the display module DM shown in FIG. 4, the second pixel definition layer PDL2 and the third pixel definition layer PDL3 may include at least one of silicon oxide and silicon nitride, and the first pixel definition layer PDL1 may be an inorganic layer including at least one of silicon oxide and silicon nitride or an organic layer including a polymer resin. According to an embodiment, in a case where each of the pixel definition layers PDL1, PDL2, and PDL3 is the inorganic layer including at least one of silicon oxide and silicon nitride, damage to the functional layers disposed under the pixel definition layer may be prevented or reduced even though a high temperature heat is provided in a subsequent process.

Meanwhile, each of the pixel definition layers PDL1, PDL2, and PDL3 is provided in a single layer, however, the present disclosure should not be limited thereto or thereby. According to an embodiment, each of the pixel definition layers PDL1, PDL2, and PDL3 may be provided in multiple layers. In addition, at least one of the multiple layers of each of the pixel definition layers PDL1, PDL2, and PDL3 may be the inorganic layer.

The first light emitting unit EU-1 may include the first lower electrode AE1 patterned and disposed on the circuit layer DP-CL, the first pixel definition layer PDL1 provided with a first pixel opening OH-P1 defined therethrough to expose an upper surface of the first lower electrode AE1, the first functional layer OL1 disposed on the first lower electrode AE1, and the first upper electrode CE1 disposed on the first functional layer OL1. In addition, the first light emitting unit EU-1 may include a first encapsulation layer TFL1 disposed on the first upper electrode CE1.

According to an embodiment, the first functional layer OL1 may be disposed to overlap not only the exposed upper surface of the first lower electrode AE1 but also the first pixel definition layer PDL1. That is, the first functional layer OL1 may be disposed to extend to the second light emitting area PXA-G and the third light emitting area PXA-B without being limited to the first light emitting area PXA-R. According to an embodiment, the first functional layer OL1 may be provided as a common layer. In addition, according to an embodiment, the first upper electrode CE1 may be disposed to overlap (e.g., overlap in the third direction DR3) the whole of or the entirety of the first functional layer OL1. The first upper electrode CE1 may be provided as a common layer. Meanwhile, the first functional layer OL1 and the first upper electrode CE1 provided as the common layer may be formed through a process performed using an open mask.

Meanwhile, different from the embodiment shown in FIG. 4, the first functional layer OL1 may be patterned without extending to the second light emitting area PXA-G and the third light emitting area PXA-B. As an example, the first functional layer OL1 may be patterned using a fine metal mask (FMM) not to overlap the second light emitting area PXA-G and the third light emitting area PXA-B. In addition, the first functional layer OL1 or the first upper electrode CE1 may be patterned by a metal self-patterning (MSP) method in which a material with a low surface energy is coated on a portion, which is to be patterned, to allow the first functional layer OL1 or the first upper electrode CE1 not to be provided in the portion that is to be patterned.

The second light emitting unit EU-2 may include the second lower electrode AE2 patterned and disposed on the first light emitting unit EU-1, the second pixel definition layer PDL2 provided with a second pixel opening OH-P2 defined therethrough to expose an upper surface of the second lower electrode AE2, the second functional layer OL2 disposed on the second lower electrode AE2, and the second upper electrode CE2 disposed on the second functional layer OL2. In addition, the second light emitting unit EU-2 may include a second encapsulation layer TFL2 disposed on the second upper electrode CE2. Meanwhile, the second lower electrode AE2 of the second light emitting unit EU-2 may be disposed on the first encapsulation layer TFL1.

According to an embodiment, the second functional layer OL2 may be disposed to overlap not only the exposed upper surface of the second lower electrode AE2 but also the second pixel definition layer PDL2. That is, according to an embodiment, the second functional layer OL2 may be disposed to extend to the first light emitting area PXA-R and the third light emitting area PXA-B without being limited to the second light emitting area PXA-G. In addition, the second functional layer OL2 may be patterned without extending to the first light emitting area PXA-R and the third light emitting area PXA-B. As in the description of the first light emitting unit EU-1, the second functional layer OL2 may be provided as a common layer or may be patterned.

The third light emitting unit EU-3 may include the third lower electrode AE3 patterned and disposed on the second light emitting unit EU-2, the third pixel definition layer PDL3 provided with a third pixel opening OH-P3 defined therethrough to expose an upper surface of the third lower electrode AE3, the third functional layer OL3 disposed on the third lower electrode AE3, and the third upper electrode CE3 disposed on the third functional layer OL3. In addition, the third light emitting unit EU-3 may include a third encapsulation layer TFL3 disposed on the third upper electrode CE3. Meanwhile, the third lower electrode AE3 of the third light emitting unit EU-3 may be disposed on the second encapsulation layer TFL2.

According to an embodiment, the third functional layer OL3 may be disposed to overlap not only the exposed upper surface of the third lower electrode AE3 but also the third pixel definition layer PDL3. That is, according to an embodiment, the third functional layer OL3 may be disposed to extend to the first light emitting area PXA-R and the second light emitting area PXA-G without being limited to the third light emitting area PXA-B. According to an embodiment, the third functional layer OL3 may be provided as the common layer using an open mask.

The first, second, and third pixel openings OH-P1, OH-P2, and OH-P3 of the first, second, and third light emitting units EU-1, EU-2, and EU-3 may correspond to the first, second, and third light emitting areas PXA-R, PXA-G, and PXA-B, respectively. The first, second, and third pixel openings OH-P1, OH-P2, and OH-P3 may not overlap each other.

Figure 6:
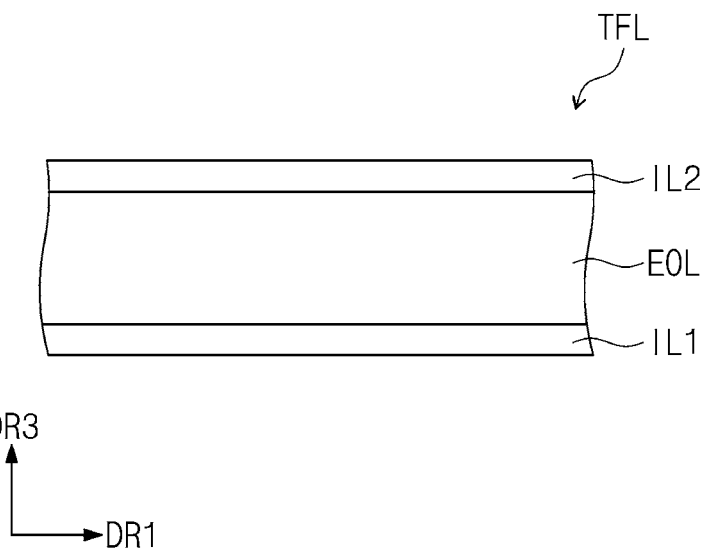
FIG. 6 is a cross-sectional view showing an encapsulation layer according to an embodiment of the present disclosure.

Referring to FIG. 4, the light emitting units EU-1, EU-2, and EU-3 may respectively include the encapsulation layers TFL1, TFL2, and TFL3 that cover the light emitting elements ED1, ED2, and ED3, respectively. FIG. 6 shows a representative example of the encapsulation layer. The encapsulation layer TFL shown in FIG. 6 is a representative example of the encapsulation layers TFL1, TFL2, and TFL3 respectively included in the light emitting units EU-1, EU-2, and EU-3 shown in FIG. 4.

The encapsulation layer TFL may include one or more inorganic layers IL1 and IL2. The encapsulation layer TFL may include the one or more inorganic layers IL1 and IL2 and at least one organic layer EOL, and the inorganic layers IL1 and IL2 may be alternately stacked with the organic layer EOL. As an example, the encapsulation layer TFL may include two inorganic layers IL1 and IL2 and the organic layer EOL disposed between the inorganic layers.

The inorganic layers IL1 and IL2 may include at least one of silicon nitride compound and silicon oxide compound such as silicon nitride, silicon oxide, and silicon oxynitride. The organic layer EOL may include an acrylate-based resin, a urethane-based resin, and an imide-based resin.

Meanwhile, the encapsulation layer TFL shown in FIG. 6 may have a three-layer structure in which a first inorganic layer IL1, the organic layer EOL, and a second inorganic layer IL2 are stacked, however, the present disclosure should not be limited thereto or thereby. The encapsulation layer TFL may include a plurality of inorganic layers and a plurality of organic layers, and the inorganic layers may be alternately stacked with the organic layers.

Referring to FIG. 4 again, the circuit layer DP-CL may include first, second, and third transistors TR-a, TR-b, and TR-c spaced from each other. In addition, the circuit layer DP-CL may include a buffer layer BFL and a plurality of insulating layers 10, 20, 30, 40, 50, and 60. In addition, the circuit layer DP-CL may include contact electrodes CNE1 and CNE2 connecting (e.g., electrically connecting) the lower electrodes AE1, AE2, and AE3 to the transistors TR-a, TR-b, and TR-c.

The buffer layer BFL may increase an adhesive force between the base layer BS and the semiconductor pattern. The buffer layer BFL may include at least one of a silicon oxide layer, a silicon nitride layer, and a silicon oxynitride layer. For example, the buffer layer BFL may have a multi-layer structure in which two or more layers selected from the silicon oxide layer, the silicon nitride layer, and the silicon oxynitride layer are alternately stacked one on another.

The transistors TR-a, TR-b, and TR-c may be disposed on the buffer layer BFL. Each of the transistors TR-a, TR-b, and TR-c may include a source (e.g., a source region) S1, an active (e.g., an active region) A1, and a drain (e.g., a drain region) D1, and the source S1, the active A1, and the drain D1 may be formed from the semiconductor pattern. The semiconductor pattern may include polysilicon, however, it should not be limited thereto or thereby. According to an embodiment, the semiconductor pattern may include amorphous silicon and/or metal oxide.

The semiconductor pattern may have different electrical properties depending on whether or not it is doped or whether it is doped with an N-type dopant or a P-type dopant. The semiconductor pattern may include a first region having a relatively high conductivity and a second region having a relatively low conductivity. The first region may be doped with the N-type dopant or the P-type dopant. The second region may be referred to as a channel area. The conductivity of the first region may be greater than the conductivity of the second region, and the first region may serve (e.g., substantially serve) as an electrode or signal line. The second region may serve (e.g., substantially serve) as an active (or a channel) of a transistor. In other words, a portion of the semiconductor pattern may be an active of the transistor, another portion of the semiconductor pattern may be a source or a drain of the transistor, and the other portion of the semiconductor pattern may be a contact electrode or a connection signal line. The source S1 and the drain D1 of the transistors TR-a, TR-b, and TR-c may extend in opposite directions from the active A1 when viewed in a cross-section.

A first insulating layer 10 may be disposed on the buffer layer BFL. The first insulating layer 10 may overlap (e.g., commonly overlap) the light emitting units EU-1, EU-2, and EU-3 and may cover the semiconductor pattern. The first insulating layer 10 may be an inorganic layer and/or an organic layer and may have a single-layer structure or a multi-layer structure. The first insulating layer 10 may include at least one of aluminum oxide, titanium oxide, silicon oxide, silicon nitride, and silicon oxynitride. In the present embodiment, the first insulating layer 10 may have a single-layer structure of a silicon oxide layer. Not only the first insulating layer 10, but also an insulating layer of the circuit layer DP-CL described later may be an inorganic layer and/or an organic layer and may have a single-layer structure or a multi-layer structure. The inorganic layer may include at least one of the above-mentioned materials, however, it should not be limited thereto.

A gate G1 of the transistors TR-a, TR-b, and TR-c may be disposed on the first insulating layer 10. The gate G1 may be a portion of a metal pattern. The gate G1 may overlap the active A1. The gate G1 may be used as a mask in a process of doping the semiconductor pattern.

A second insulating layer 20 may be disposed on the first insulating layer 10 and may cover the gate G1. The second insulating layer 20 may overlap (e.g., commonly overlap) the pixels. The second insulating layer 20 may be an inorganic layer and/or an organic layer and may have a single-layer structure or a multi-layer structure that includes at least one of a silicon oxide layer, a silicon nitride layer, and a silicon oxynitride layer.

A third insulating layer 30 may be disposed on the second insulating layer 20 and may include a single-layer structure or a multi-layer structure that includes at least one of a silicon oxide layer, a silicon nitride layer, and a silicon oxynitride layer.

A fourth insulating layer 40 may be disposed on the third insulating layer 30. The fourth insulating layer 40 may include a single-layer structure or a multi-layer structure that includes at least one of a silicon oxide layer, a silicon nitride layer, and a silicon oxynitride layer.

A first contact electrode CNE1 may be disposed on the fourth insulating layer 40. The first contact electrode CNE1 may be connected to the transistors TR-a, TR-b, and TR-c via a contact hole CNT-1 defined through the first, second, and third insulating layers 10, 20, and 30.

A fifth insulating layer 50 may be disposed on the fourth insulating layer 40. The fifth insulating layer 50 may be an organic layer. A second contact electrode CNE2 may be disposed on the fifth insulating layer 50. The second contact electrode CNE2 may be connected to the first contact electrode CNE1 via a contact hole CNT-2 defined through the fifth insulating layer 50.

A sixth insulating layer 60 may be disposed on the fifth insulating layer 50 and may cover the second contact electrode CNE2. The sixth insulating layer 60 may be an organic layer. The lower electrodes AE1, AE2, and AE3 may be disposed on the sixth insulating layer 60. The lower electrodes AE1, AE2, and AE3 may be connected to the second contact electrode CNE2 via a contact hole CNT-3 defined through the sixth insulating layer 60.

The first, second, and third transistors TR-a, TR-b, and TR-c included in the circuit layer DP-CL may be connected (e.g., electrically connected) to the first, second, and third light emitting units EU-1, EU-2, and EU-3, respectively. The first, second, and third transistors TR-a, TR-b, and TR-c may be each independently driven and controlled. A contact electrode CNE included in the circuit layer DP-CL may connect (e.g., electrically connect) the first, second, and third transistors TR-a, TR-b, and TR-c to the first, second, and third light emitting units EU-1, EU-2, and EU-3, respectively.

Meanwhile, the number of the insulating layers, positions of the contact electrodes, the number of the contact electrodes, and the positions of the transistors, which are included in the circuit layer DP-CL, should not be limited to the embodiment described with reference to FIG. 4 and may be changed depending on a design of the circuit layer DP-CL of the display module DM.

According to an embodiment, the display element layer DP-ED of the display module DM may be provided with a first opening OH1 and a second opening OH2, which are defined therethrough. The first opening OH1 may be defined through the first light emitting unit EU-1, and the second opening OH2 may be defined through the first light emitting unit EU-1 and the second light emitting unit EU-2.

In the embodiment shown in FIG. 4, the second lower electrode AE2 may be disposed in the first opening OH1, and the second lower electrode AE2 may be connected (e.g., electrically connected) to the circuit layer DP-CL via the first opening OH1. In addition, the third lower electrode AE3 may be disposed in the second opening OH2, and the third lower electrode AE3 may be connected (e.g., electrically connected) to the circuit layer DP-CL via the second opening OH2.

Figure 7:
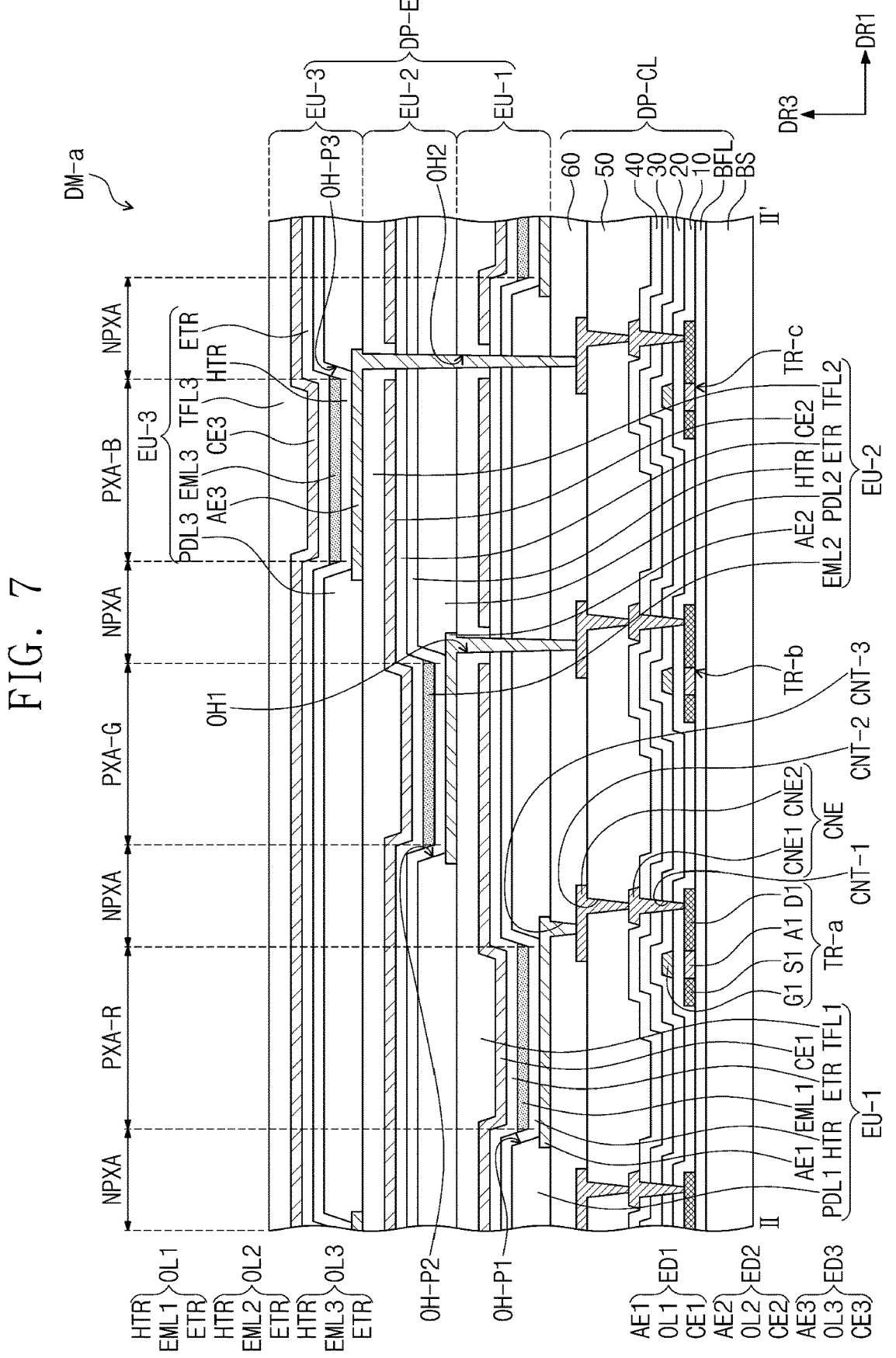
FIG. 7 is a cross-sectional view showing a display module according to an embodiment of the present disclosure.

FIG. 7 is a cross-sectional view showing a display module DM-a according to an embodiment of the present disclosure. The display module DM-a shown in FIG. 7 is different from the display module DM shown in FIG. 4 only in an arrangement of functional layers OL1, OL2, and OL3.

Referring to FIG. 7, each of the functional layers OL1, OL2, and OL3 may include a hole transport region HTR, a corresponding light emitting layer of light emitting layers EML1, EML2, and EML3, and an electron transport region ETR. The light emitting layers EML1, EML2, and EML3 of first, second, and third functional layers OL1, OL2, and OL3 may emit light in different wavelength regions. As an example, a first light emitting layer EML1 of a first light emitting unit EU-1 may emit red light, a second light emitting layer EML2 of a second light emitting unit EU-2 may emit green light, and a third light emitting layer EML3 of a third light emitting unit EU-3 may emit blue light in the display module DM-a shown in FIG. 7, however, the present disclosure should not be limited thereto or thereby. According to an embodiment, wavelength regions of the lights respectively emitted from the first light emitting layer EML1 to the third light emitting layer EML3 may correspond to those of lights other than the red light, the green light, and the blue light.

Referring to FIG. 7, among configurations of the first functional layer OL1 of a light emitting element ED1, the first light emitting layer EML1 may be patterned, and the hole transport region HTR and the electron transport region ETR, which are functional layers, may be provided as a common layer. In addition, a first upper electrode CE1 may also be provided as a common layer on the electron transport region ETR.

Among configurations of the second functional layer OL2 of a light emitting element ED2 in the display module DM-a, the second light emitting layer EML2 may be patterned, and the hole transport region HTR and the electron transport region ETR, which are functional layers, may be provided as a common layer. A second upper electrode CE2 may also be provided as a common layer on the electron transport region ETR. In addition, among configurations of the third functional layer OL3 of a light emitting element ED3, the third light emitting layer EML3 may be patterned, and the hole transport region HTR and the electron transport region ETR, which are functional layers, may be provided as a common layer. A third upper electrode CE3 may also be provided as a common layer on the electron transport region ETR.

Meanwhile, in one or more embodiments, the hole transport region HTR and the electron transport region ETR may be patterned to correspond to the light emitting areas PXA-R, PXA-G, and PXA-B. In addition, the first upper electrode CE1 and the second upper electrode CE2 may be patterned to correspond to the light emitting areas PXA-R, PXA-G, and PXA-B. In the case where the first upper electrode CE1 and the second upper electrode CE2 are patterned, the first upper electrode CE1 and the second upper electrode CE2 may be connected (e.g., electrically connected) to external signal lines, respectively, via contact holes defined through the functional layers OL1 and OL2, pixel definition layers PDL1 and PDL2, and encapsulation layers TFL1 and TFL2. Because the display device DD includes the light emitting units EU-1, EU-2, and EU-3 stacked in the thickness direction, a size of a non-light-emitting area NPXA or a width of the non-light-emitting area NPXA disposed between light emitting areas may be reduced compared with a related art display device including a plurality of light emitting units arranged on or at the same plane. That is, according to an embodiment, because the light emitting units EU-1, EU-2, and EU-3 of the display device DD are disposed on or at different planes or different layers, limitations in performing the patterning process to distinguish adjacent light emitting units from each other may be overcome. Accordingly, the size of the light emitting area of the display device DD according to the present embodiment may increase when compared with the related art display device in which the light emitting units are disposed on or at the same plane. In addition, as the number of light emitting areas and the size of the light emitting areas are adjusted without being restricted by the limitations of the patterning process, the display device including the light emitting units EU-1, EU-2, and EU-3 stacked in the thickness direction may have excellent resolution.

Hereinafter, display devices will be described in more detail with reference to FIGS. 8A, 8B, and 9 to 16 according to embodiments of the present disclosure. In descriptions of FIGS. 8A to 16, details of the same elements as those described with reference to FIGS. 1 to 7 will not be described again hereinafter, and different features will be primarily described.

Figure 8A:
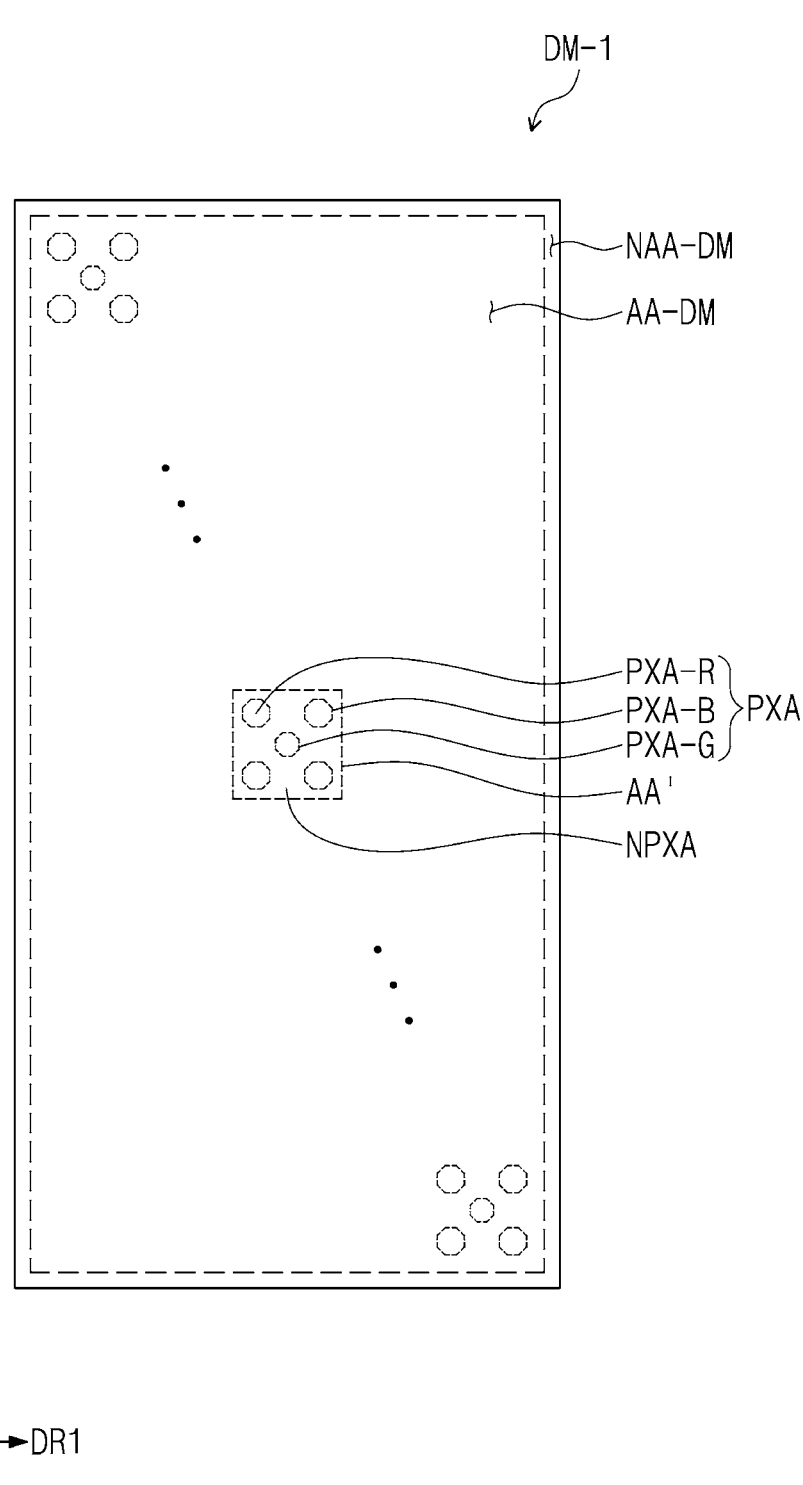
FIG. 8A is a plan view showing a display module according to an embodiment of the present disclosure.
Figure 8B:
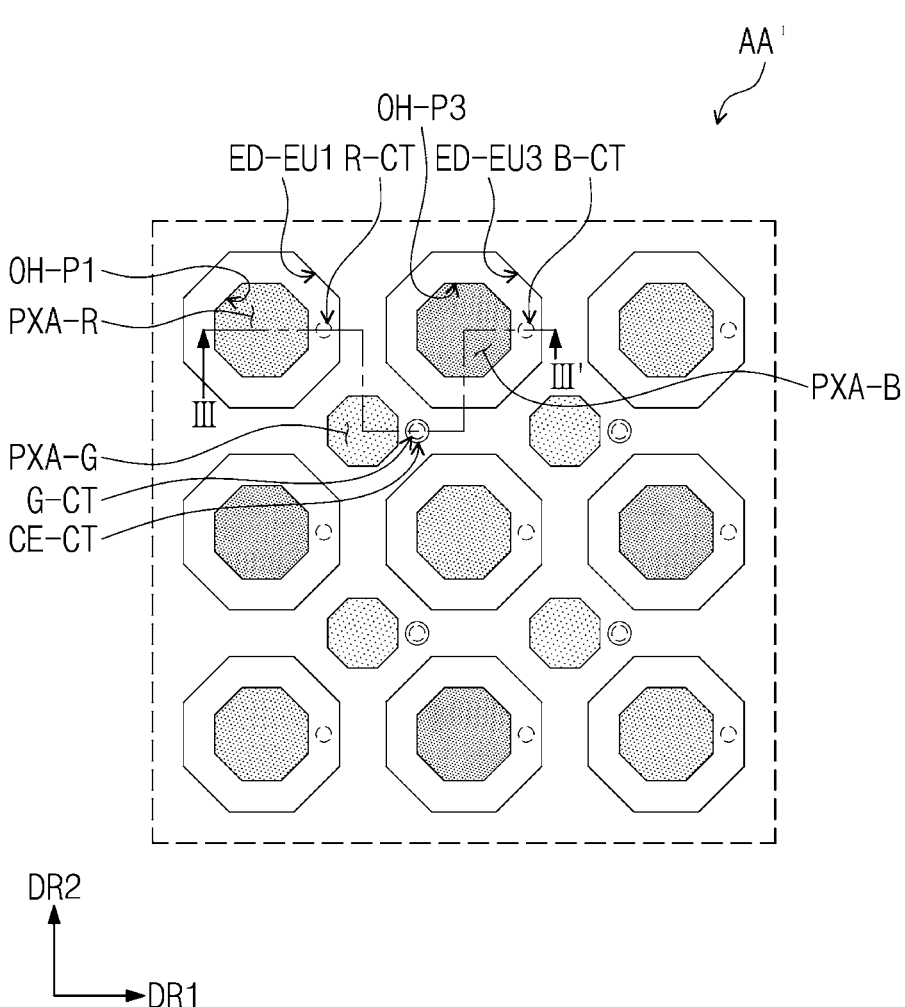
FIG. 8B is a plan view showing a portion of a display module according to an embodiment of the present disclosure.
Figure 9:
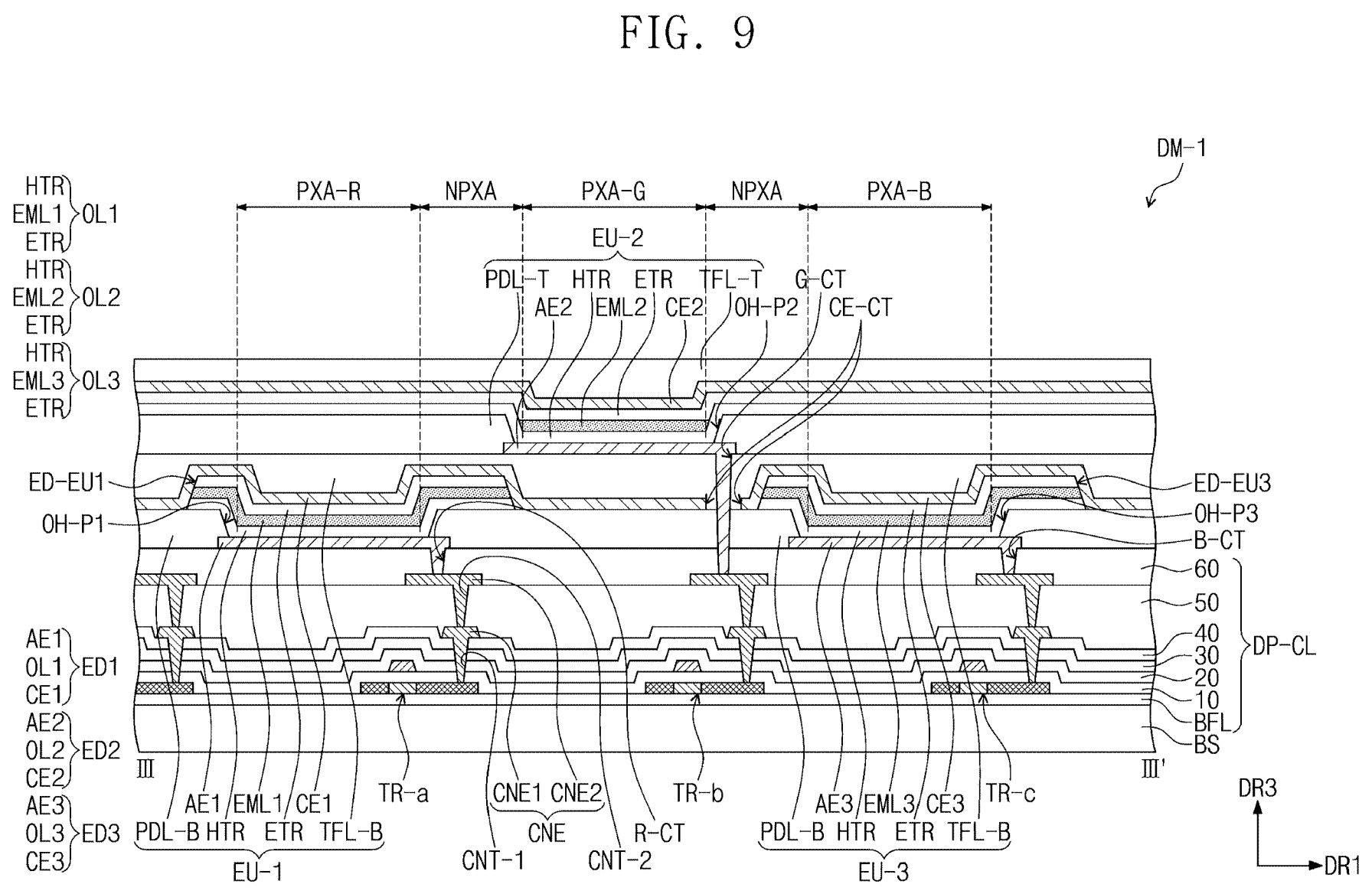

FIG. 8A is a plan view showing a display module DM-1 according to an embodiment, and FIG. 8B is a plan view showing a portion of the display module. FIG. 8B is a plan view showing an area AA' of FIG. 8A in more detail. FIG. 9 is a cross-sectional view showing the display module DM-1 according to an embodiment. FIG. 9 shows a cross-section taken along the line III-III' of FIG. 8B.

Referring to FIGS. 8A to 9, the display module DM-1 may include first, second, and third light emitting areas PXA-R, PXA-G, and PXA-B. As an example, the display module DM-1 may include a first light emitting area PXA-R emitting red light, a second light emitting area PXA-G emitting green light, and a third light emitting area PXA-B emitting blue light.

In the embodiment shown in FIGS. 8A and 8B, when viewed in a plane or in a plan view defined by the first directional axis DR1 and the second directional axis DR2, each of the first, second, and third light emitting areas PXA-R, PXA-G, and PXA-B may have an octagonal shape, however, the present disclosure should not be limited thereto or thereby. According to an embodiment, the shape of the light emitting areas PXA-R, PXA-G, and PXA-B in a plane or in a plan view may be changed in various suitable ways. As an example, the light emitting areas PXA-R, PXA-G, and PXA-B may have a quadrangular shape as shown in FIG. 3, a polygonal shape, or a shape including a curved surface in or at its corner.

From among the first, second, and third light emitting areas PXA-R, PXA-G, and PXA-B of the display module DM-1, at least one light emitting area may have a size different from that of the other light emitting areas when viewed in a plane or in a plan view. In addition, the first, second, and third light emitting areas PXA-R, PXA-G, and PXA-B may have different sizes from each other. As an example, one second light emitting area PXA-G may have the size smaller than the size of one first light emitting area PXA-R or one third light emitting area PXA-B, however, present disclosure should not be limited thereto or thereby.

Referring to FIGS. 8A and 8B, the first light emitting area PXA-R and the third light emitting area PXA-B may be alternately arranged with each other in the first directional axis DR1. In addition, the first light emitting area PXA-R and the third light emitting area PXA-B may also be alternately arranged with each other in the second directional axis DR2. The second light emitting area PXA-G may be disposed between two first light emitting areas PXA-R adjacent to each other in a diagonal direction and between two third light emitting areas PXA-B adjacent to each other in a diagonal direction.

Different from embodiments shown in FIGS. 4 and 7, in the display module DM-1 shown in FIGS. 8A to 9, one light emitting unit selected from first, second, and third light emitting units EU-1, EU-2, and EU-3 may be disposed on or at a different layer from the other light emitting units in the thickness direction. Referring to FIG. 9, the first light emitting unit EU-1 and the third light emitting unit EU-3 of the display module DM-1 may be disposed at a relatively lower position, and the second light emitting unit EU-2 may be disposed at a position higher than a position of the first light emitting unit EU-1 and the third light emitting unit EU-3.

In the embodiment shown in FIG. 9, first, second, and third pixel openings OH-P1, OH-P2, and OH-P3 may not overlap each other. In the display module DM-1 shown in FIG. 9 according to an embodiment, the first light emitting unit EU-1 may include a first lower electrode AE1, a first functional layer OL1, a first upper electrode CE1, a lower pixel definition layer PDL-B, and a lower encapsulation layer TFL-B. The third light emitting unit EU-3 may include a third lower electrode AE3, a third functional layer OL3, a third upper electrode CE3, the lower pixel definition layer PDL-B, and the lower encapsulation layer TFL-B. In addition, the second light emitting unit EU-2 may include a second lower electrode AE2, a second functional layer OL2, a second upper electrode CE2, an upper pixel definition layer PDL-T, and an upper encapsulation layer TFL-T.

Referring to FIGS. 8B and 9, the upper electrodes CE1 and CE3 of the first light emitting unit EU-1 and the third light emitting unit EU-3, which are disposed at the lower position, may be spaced from a second lower electrode opening G-CT on which the second lower electrode AE2 of the second light emitting unit EU-2 disposed at the upper position is disposed. Edges CE-CT of the upper electrodes CE1 and CE3 of the first light emitting unit EU-1 and the third light emitting unit EU-3 may be formed to be spaced from the second lower electrode opening G-CT. In one or more embodiments, the edges CE-CT of the upper electrodes CE1 and CE3 of the first light emitting unit EU-1 and the third light emitting unit EU-3 may be around the second lower electrode opening G-CT in a plan view.

Accordingly, when viewed in a plane or in a plan view as shown in FIG. 8B, the line formed by the edges CE-CT of the upper electrodes CE1 and CE3 of the first light emitting unit EU-1 and the third light emitting unit EU-3 may be positioned spaced from the line formed by the second lower electrode opening G-CT on which the second lower electrode AE2 of the second light emitting unit EU-2 is disposed. As an example, when viewed in a plane or in a plan view, a width of a portion defined by the line formed by the edges CE-CT of the upper electrodes CE1 and CE3 of the first light emitting unit EU-1 and the third light emitting unit EU-3 may be greater than a width of a portion defined by the line formed by the second lower electrode opening G-CT.

That is, referring to FIGS. 8B and 9, the first upper electrode CE1 and the third upper electrode CE3 of the display module DM-1 may be spaced from the second lower electrode opening G-CT and may be disposed at the other portion except the portion defined by the line formed by the edges CE-CT of the upper electrodes CE1 and CE3. In addition, the second upper electrode CE2 may be disposed over the whole of or the entirety of the first, second, and third light emitting areas PXA-R, PXA-G, and PXA-B as a common layer. That is, the second upper electrode CE2 may be provided to cover the portion (e.g., the entire portion) defined by the line formed by the edges CE-CT of the upper electrodes CE1 and CE3 shown in FIG. 8B and the portion (e.g., the entire portion) defined by the line formed by the second lower electrode opening G-CT.

A first lower electrode opening R-CT and a third lower electrode opening B-CT of FIG. 8B may respectively correspond to the contact hole CNT-3 and the second opening OH2 shown in FIG. 4. In addition, the second lower electrode opening G-CT of FIG. 8B may correspond to the first opening OH1 shown in FIG. 4.

Referring to FIG. 9, the first functional layer OL1 may be disposed to overlap an area corresponding to the first pixel opening OH-P1 and portions of the lower pixel definition layer PDL-B defining the first pixel opening OH-P1 in the display module DM-1. According to an embodiment, the first functional layer OL1 may be patterned to allow an edge ED-EU1 to be disposed on the lower pixel definition layer PDL-B. As an example, a hole transport region HTR, a light emitting layer EML1, and an electron transport region ETR of the first light emitting unit EU-1 may be patterned to be provided in a portion exposed through the first pixel opening OH-P1 and to extend to an upper portion of the lower pixel definition layer PDL-B neighboring the first pixel opening OH-P1.

Referring to FIGS. 8B and 9, the edge ED-EU1 defined by patterning the hole transport region HTR, the light emitting layer EML1, and the electron transport region ETR of the first functional layer OL1 may have an octagonal shape when viewed in a plane or in a plan view. However, the shape of the edge ED-EU1 defined by patterning the first functional layer OL1 in the plane should not be limited to the shape shown in FIG. 8B and may be changed in various suitable ways according to embodiments of the present disclosure. For example, the shape of the edge ED-EU1 may be changed according to a design of the light emitting area desired for the display device.

Referring to the embodiment shown in FIG. 8B, when viewed in a plane or in a plan view, a plane defined by the edge ED-EU1 provided by patterning the first functional layer OL1 may be positioned in or at an area defined by the first pixel opening OH-P1. In addition, the first lower electrode opening R-CT may be positioned in or at the area defined by the first pixel opening OH-P1. In one or more embodiments, the edge ED-EU1 may be around the first pixel opening OH-P1 in a plan view.

In the embodiment shown in FIGS. 8B and 9, the third functional layer OL3 may be disposed to overlap an area corresponding to the third pixel opening OH-P3 and portions of the lower pixel definition layer PDL-B defining the third pixel opening OH-P3. According to an embodiment, the third functional layer OL3 may be patterned to allow an edge ED-EU3 to be positioned on the lower pixel definition layer PDL-B. As an example, a hole transport region HTR, a light emitting layer EML3, and an electron transport region ETR of the third light emitting unit EU-3 may be patterned to be provided in a portion exposed through the third pixel opening OH-P3 and to extend to an upper portion of the lower pixel definition layer PDL-B neighboring the third pixel opening OH-P3. In one or more embodiments, the edge ED-EU3 may be around the third pixel opening OH-P3 in a plan view.

Referring to FIG. 8B, the edge ED-EU3 defined by patterning the hole transport region HTR, the light emitting layer EML3, and the electron transport region ETR of the third functional layer OL3 may have an octagonal shape when viewed in a plane or in a plan view, however, the present disclosure should not be limited thereto or thereby. In addition, when viewed in a plane or in a plan view, a plane defined by the edge ED-EU3 provided by patterning the third functional layer OL3 and the third lower electrode opening B-CT may be positioned in the third pixel opening OH-P3.

In addition, a second light emitting layer EML2 of the second light emitting unit EU-2 may be patterned and disposed in the second pixel opening OH-P2 in the display module DM-1. In addition, a hole transport region HTR and an electron transport region ETR of the second light emitting unit EU-2 may be provided as a common layer.

Meanwhile, the arrangements and the shapes of the functional layers OL1, OL2, and OL3 of the display module DM-1 when viewed in a plane or in a plan view should not be limited to those shown in FIGS. 8B and 9. As an example, the first, second, and third functional layers OL1, OL2, and OL3 may be patterned and provided in the first, second, and third pixel openings OH-P1, OH-P2, and OH-P3, respectively. According to an embodiment, the light emitting layers EML1, EML2, and EML3 of the first, second, and third functional layers OL1, OL2, and OL3 may be patterned and provided in the first, second, and third pixel openings OH-P1, OH-P2, and OH-P3, respectively, and the hole transport region HTR and the electron transport region ETR of the first, second, and third functional layers OL1, OL2, and OL3 may be provided as a common layer. In the embodiment shown in FIG. 9, the first functional layer OL1 and the third functional layer OL3 may be patterned using a fine metal mask or by an MSP method.

In the display module DM-1 shown in FIG. 9, descriptions on the first, second, and third pixel definition layers PDL1, PDL2, and PDL3 described with reference to FIG. 4 may be applied to the lower pixel definition layer PDL-B and the upper pixel definition layer PDL-T. In addition, according to an embodiment, the upper pixel definition layer PDL-T may be an inorganic layer including at least one of silicon oxide and silicon nitride.

Descriptions on the encapsulation layer TFL described with reference to FIG. 6 may also be applied to the lower encapsulation layer TFL-B and the upper encapsulation layer TFL-T. As an example, each of the lower encapsulation layer TFL-B and the upper encapsulation layer TFL-T may include at least one inorganic layer.

According to the display module DM-1 described with reference to FIGS. 8A, 8B, and 9, at least one light emitting unit from among the light emitting units may be disposed on a layer different from a layer on which the other light emitting units from among the light emitting units are disposed, and thus, the light emitting area may increase compared with a case where all the light emitting units are disposed on or at the same plane or on or at the same layer.

Figure 10:
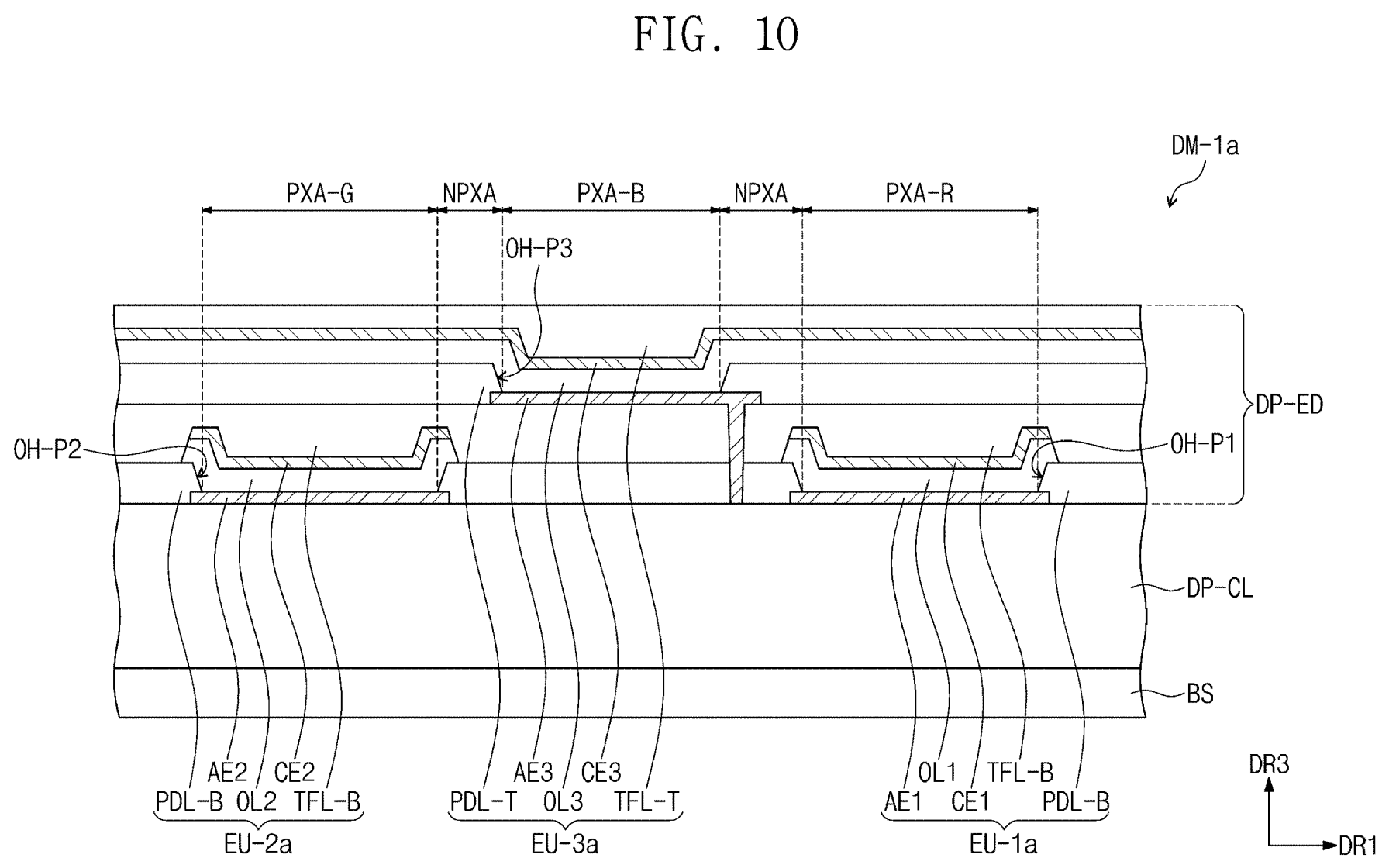

FIGS. 10 and 11 are cross-sectional views respectively showing display modules DM-1a and DM-1b according to embodiments. According to the embodiments shown in FIGS. 10 and 11, first, second, and third light emitting units may be included in display element layers DP-ED. In FIGS. 10 and 11, a circuit layer DP-CL is schematically shown as a single layer, however, the structure of the circuit layer DP-CL described with reference to FIG. 9 may be applied to the circuit layer DP-CL shown in FIGS. 10 and 11.

According to the display modules DM-1a and DM-1b shown in FIGS. 10 and 11, one light emitting unit selected from the first, second, and third light emitting units may be disposed on or at a different plane from the other light emitting units in the thickness direction. The display modules DM-1a and DM-1b shown in FIGS. 10 and 11 have differences in arrangement of the first, second, and third light emitting units when compared with the display module DM-1 shown in FIG. 9.

Referring to FIG. 10, a first light emitting unit EU-1a and a second light emitting unit EU-2a may be disposed at a relatively lower position in the display module DM-1a, and a third light emitting unit EU-3a may be disposed at a position higher than the first light emitting unit EU-1a and the second light emitting unit EU-2a in the display module DM-1a. Referring to FIG. 11, a second light emitting unit EU-2b may be disposed at a relatively lower position in the display module DM-1b, and a first light emitting unit EU-1b and a third light emitting unit EU-3b may be disposed at a position higher than the second light emitting unit EU-2b in the display module DM-1b. In the embodiments shown in FIGS. 10 and 11, first, second, and third pixel openings OH-P1, OH-P2, and OH-P3 may not overlap each other.

In the display module DM-1a shown in FIG. 10, the first light emitting unit EU-1a may include a first lower electrode AE1, a first functional layer OL1, a first upper electrode CE1, a lower pixel definition layer PDL-B, and a lower encapsulation layer TFL-B. The second light emitting unit EU-2a may include a second lower electrode AE2, a second functional layer OL2, a second upper electrode CE2, the lower pixel definition layer PDL-B, and the lower encapsulation layer TFL-B. The third light emitting unit EU-3a may include a third lower electrode AE3, a third functional layer OL3, a third upper electrode CE3, an upper pixel definition layer PDL-T, and an upper encapsulation layer TFL-T.

In the display module DM-1b shown in FIG. 11, the first light emitting unit EU-1b may include a first lower electrode AE1, a first functional layer OL1, a first upper electrode CE1, an upper pixel definition layer PDL-T, and an upper encapsulation layer TFL-T. The second light emitting unit EU-2b may include a second lower electrode AE2, a second functional layer OL2, a second upper electrode CE2, a lower pixel definition layer PDL-B, and a lower encapsulation layer TFL-B. The third light emitting unit EU-3*b* may include a third lower electrode AE3, a third functional layer OL3, a third upper electrode CE3, the upper pixel definition layer PDL-T, and the upper encapsulation layer TFL-T.

Details of the first, second, and third pixel definition layers PDL1, PDL2, and PDL3 described with reference to FIG. 4 may be applied to the lower pixel definition layer PDL-B and the upper pixel definition layer PDL-T. In addition, according to an embodiment, the upper pixel definition layer PDL-T may be an inorganic layer including at least one of silicon oxide and silicon nitride.

Details of the encapsulation layer TFL described with reference to FIG. 6 may be applied to the lower encapsulation layer TFL-B and the upper encapsulation layer TFL-T. As an example, each of the lower encapsulation layer TFL-B and the upper encapsulation layer TFL-T may include at least one inorganic layer.

Referring to FIG. 10, the first functional layer OL1 and the second functional layer OL2 may be disposed on or at the same plane or on the same layer, and the third functional layer OL3 may be disposed on or at a different plane or a different layer from the first functional layer OL1 and the second functional layer OL2 in the thickness direction. In the display module DM-1*a* according to the embodiment, the first functional layer OL1 and the second functional layer OL2 may not overlap each other, and the third functional layer OL3 may overlap the first functional layer OL1 and the second functional layer OL2. In the embodiment shown in FIG. 10, the first functional layer OL1, the first upper electrode CE1, the second functional layer OL2, and the second upper electrode CE2 may be patterned using a fine metal mask, and the third functional layer OL3 and the third upper electrode CE3 may be provided using an open mask. In addition, the first functional layer OL1, the first upper electrode CE1, the second functional layer OL2, and the second upper electrode CE2 may be patterned by an MSP method.

Referring to FIG. 11, the first functional layer OL1 and the third functional layer OL3 may be disposed on or at the same plane, and the second functional layer OL2 may be disposed on or at a different plane from the first functional layer OL1 and the third functional layer OL3 in the thickness direction. In the display module DM-1*b* according to the embodiment, the first functional layer OL1 and the third functional layer OL3 may not overlap each other, and the second functional layer OL2 may overlap the first functional layer OL1 and the third functional layer OL3. In the embodiment shown in FIG. 11, the first functional layer OL1 and the third functional layer OL3 may be patterned by the fine metal mask or the MSP method, and the second functional layer OL2 and the second upper electrode CE2 may be provided using the open mask. In addition, the present disclosure should not be limited thereto or thereby. According to an embodiment, the second functional layer OL2 and the second upper electrode CE2 may also be patterned by the fine metal mask or the MSP method.

Meanwhile, the third functional layer OL3 of FIG. 10 and the second functional layer OL2 of FIG. 11 are provided as a common layer, however, different from those shown in FIGS. 10 and 11, a light emitting layer of the third functional layer OL3 and a light emitting layer of the second functional layer OL2 may be patterned to be disposed in the third pixel opening OH-P3 and the second pixel opening OH-P2, respectively.

Figure 12:
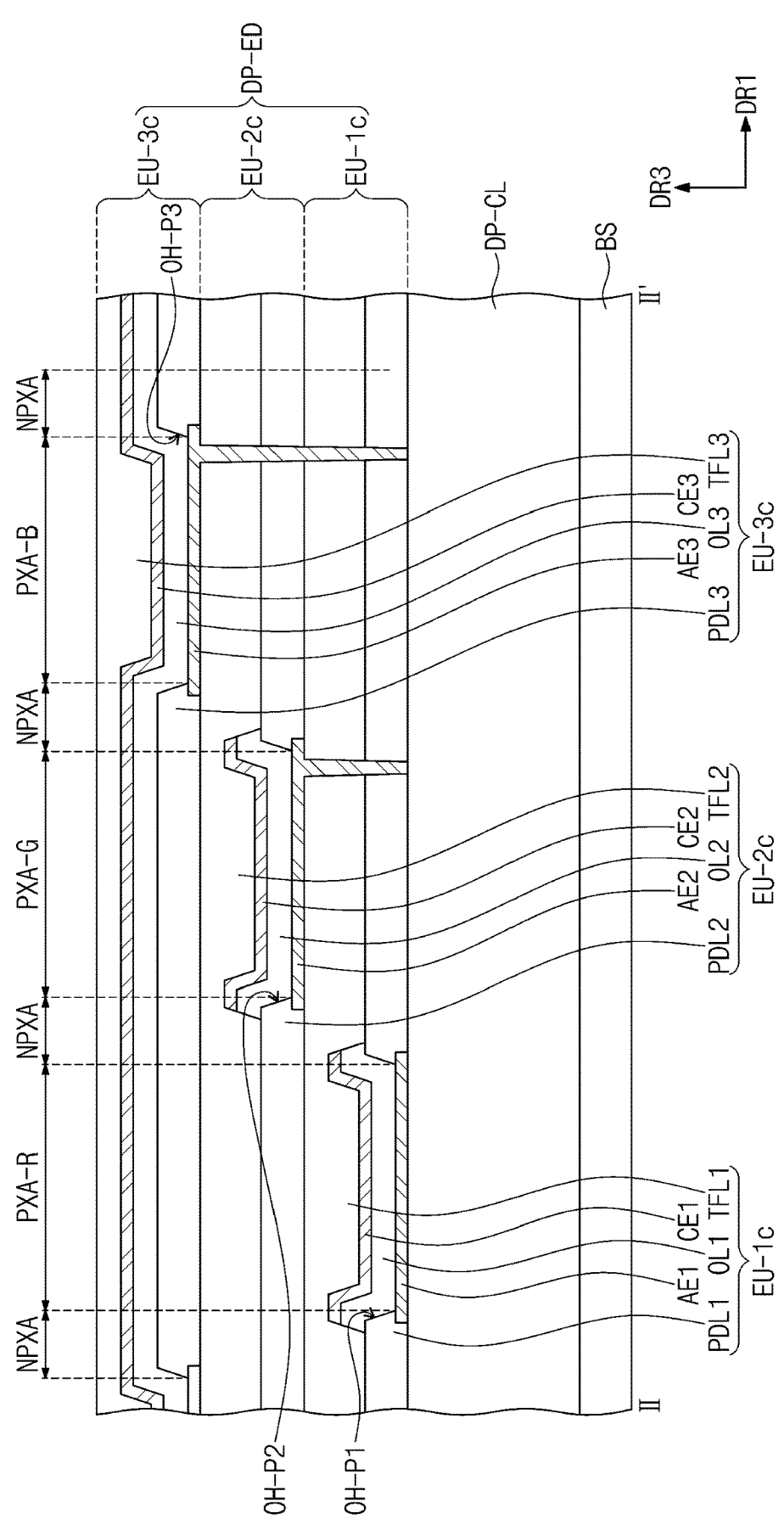
FIG. 12 is a cross-sectional view showing a display module according to an embodiment of the present disclosure.

FIG. 12 is a cross-sectional view showing a display module DM-2 according to an embodiment. FIG. 12 shows a cross-section taken along the line II-II' of FIG. 3. According to the display module DM-2 shown in FIG. 12, first, second, and third light emitting units EU-1*c*, EU-2*c*, and EU-3*c* may be included in a display element layer DP-ED. In FIG. 12, a circuit layer DP-CL is schematically shown as a single layer, however, the structure of the circuit layer DP-CL described with reference to FIG. 4 may be applied to the circuit layer DP-CL shown in FIG. 12. In the embodiment shown in FIG. 12, a functional layer and an upper electrode of the light emitting units disposed at a lower position from among the first to third light emitting units are different in that they are provided as a patterned layer rather than a common layer when compared with the embodiment shown in FIG. 4.

Referring to FIG. 12, the display element layer DP-ED may include the first light emitting unit EU-1*c*, the second light emitting unit EU-2*c* disposed on the first light emitting unit EU-1*c*, and the third light emitting unit EU-3*c* disposed on the second light emitting unit EU-2*c*. In the embodiment shown in FIG. 12, first, second, and third pixel openings OH-P1, OH-P2, and OH-P3 may not overlap each other.

In the display module DM-2 shown in FIG. 12, a first functional layer OL1 and a first upper electrode CE1 may not overlap a second light emitting area PXA-G and a third light emitting area PXA-B, and a second functional layer OL2 and a second upper electrode CE2 may not overlap a first light emitting area PXA-R and the third light emitting area PXA-B. A third functional layer OL3 and a third upper electrode CE3 may overlap the first functional layer OL1, the first upper electrode CE1, the second functional layer OL2, and the second upper electrode CE2. As an example, in the embodiment shown in FIG. 12, the first functional layer OL1, the first upper electrode CE1, the second functional layer OL2, and the second upper electrode CE2 may be patterned by a fine metal mask or an MSP method, and the third functional layer OL3 and the third upper electrode CE3 may be provided using an open mask. Meanwhile, the first upper electrode CE1 may be connected (e.g., electrically connected) to the circuit layer DP-CL and an external signal line via a contact hole defined through the first functional layer OL1 and a first pixel definition layer PDL1. In addition, the second upper electrode CE2 may be connected (e.g., electrically connected) to the circuit layer DP-CL and the external signal line via a contact hole defined through the second functional layer OL2, a second pixel definition layer PDL2, the first pixel definition layer PDL1, and a first encapsulation layer TFL1.

Figure 13:
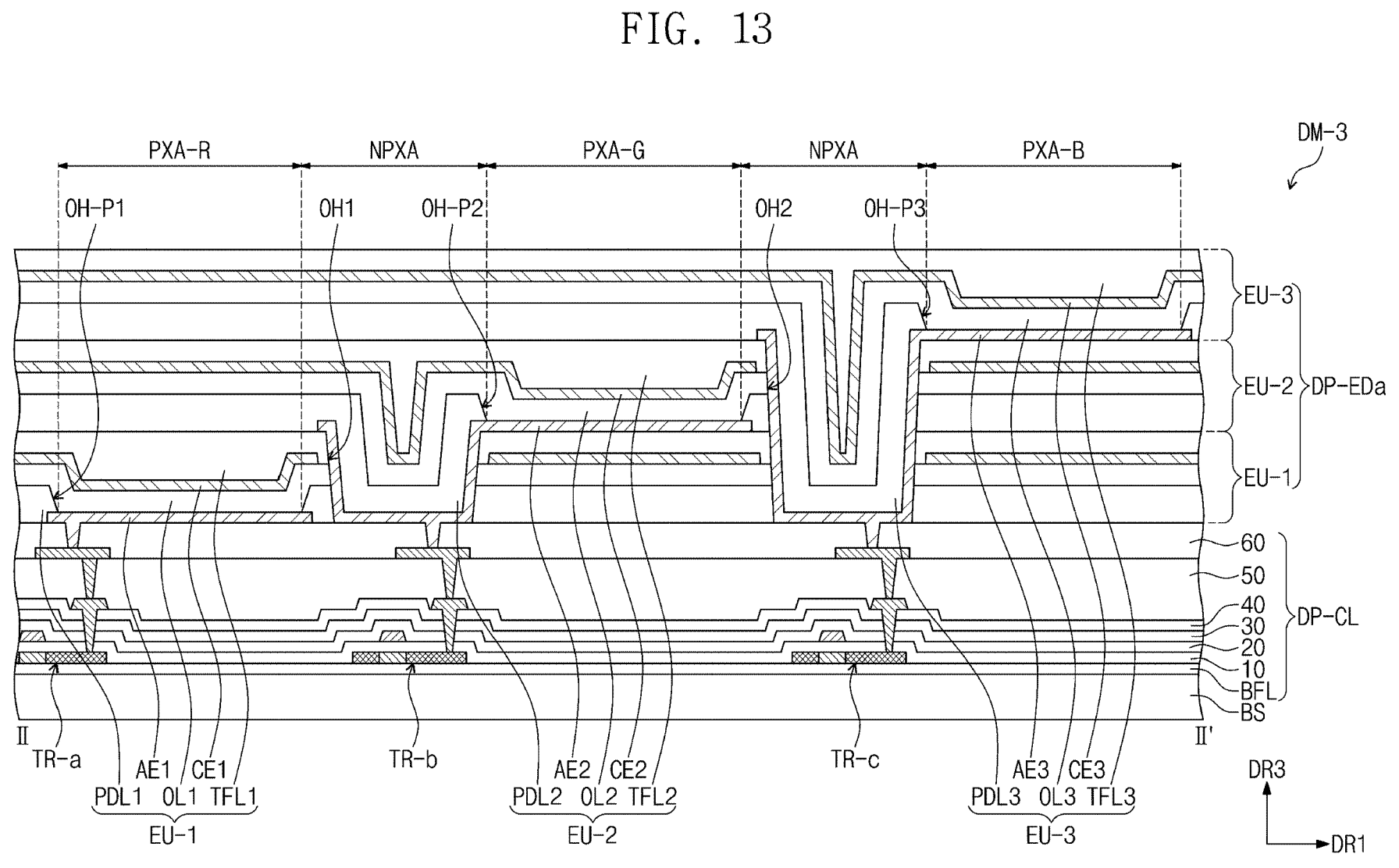

FIG. 13 is a cross-sectional view showing a display module DM-3 according to an embodiment. FIG. 13 shows a cross-section taken along the line II-II' of FIG. 3. The display module DM-3 shown in FIG. 13 may include first, second, and third light emitting areas PXA-R, PXA-G, and PXA-B spaced from each other and a non-light-emitting area NPXA disposed between the light emitting areas PXA-R, PXA-G, and PXA-B adjacent to each other.

Referring to FIG. 13, a display element layer DP-EDa may include a first light emitting unit EU-1, a second light emitting unit EU-2, and a third light emitting unit EU-3, which are sequentially stacked on a circuit layer DP-CL. A first pixel opening OH-P1, a second pixel opening OH-P2, and a third pixel opening OH-P3 of the first light emitting unit EU-1, the second light emitting unit EU-2, and the third light emitting unit EU-3 may correspond to the first light emitting area PXA-R, the second light emitting area PXA-G, and the third light emitting area PXA-B, respectively.

In the embodiment shown in FIG. 13, a first opening OH1 and a second opening OH2 may be defined through the display element layer DP-EDa. The first opening OH1 may be defined through the first light emitting unit EU-1, and the second opening OH2 may be defined through the first light emitting unit EU-1 and the second light emitting unit EU-2. In addition, the first opening OH1 may be defined to correspond to the non-light-emitting area NPXA between the first light emitting area PXA-R and the second light emitting area PXA-G, and the second opening OH2 may be defined to correspond to the non-light-emitting area NPXA between the second light emitting area PXA-G and the third light emitting area PXA-B.

A second lower electrode AE2 may be disposed in the first opening OH1, and the second lower electrode AE2 may be connected (e.g., electrically connected) to the circuit layer DP-CL via the first opening OH1. In addition, a third lower electrode AE3 may be disposed in the second opening OH2, and the third lower electrode AE3 may be connected (e.g., electrically connected) to the circuit layer DP-CL via the second opening OH2.

Referring to FIG. 13, the second lower electrode AE2, a second pixel definition layer PDL2, a second functional layer OL2, a second upper electrode CE2, and a second encapsulation layer TFL2 may extend to the first opening OH1 and may be disposed in the first opening OH1. In addition, the third lower electrode AE3, a third pixel definition layer PDL3, a third functional layer OL3, a third upper electrode CE3, and a third encapsulation layer TFL3 may extend to the second opening OH2 and may be disposed in the second opening OH2.

The second lower electrode AE2, the second pixel definition layer PDL2, the second functional layer OL2, the second upper electrode CE2, and the second encapsulation layer TFL2 may be disposed along portions defining the first opening OH1 to fill the first opening OH1. In addition, the third lower electrode AE3, the third pixel definition layer PDL3, the third functional layer OL3, the third upper electrode CE3, and the third encapsulation layer TFL3 may be disposed along portions defining the second opening OH2 to fill the second opening OH2.

Meanwhile, a width in a direction of the first directional axis DR1 of the non-light-emitting area NPXA in FIG. 13 may be smaller than a width in the direction of the first directional axis DR1 of the light emitting areas PXA-R, PXA-G, and PXA-B. FIG. 13 shows the structure in which a portion or elements of the second light emitting unit EU-2 and a portion or elements of the third light emitting unit EU-3 are in (e.g., filled in) the first opening OH1 and the second opening OH2, respectively, however, the present disclosure should not be limited thereto or thereby. A size of the first opening OH1 and a size of the second opening OH2 may be reduced within a range in which the second lower electrode AE2 and the third lower electrode AE3 are connected (e.g., electrically connected) to the circuit layer DP-CL disposed thereunder in the first opening OH1 and the second opening OH2, and thus, a size of the non-light-emitting area NPXA may be reduced.

That is, the display device including the display module DM-3 shown in FIG. 13 may include the light emitting units EU-1, EU-2, and EU-3 stacked in the thickness direction, and at least one functional layer from among the functional layers OL1, OL2, and OL3 of the light emitting units EU-1, EU-2, and EU-3 may be disposed on or at a different plane from the other functional layers from among the functional layers OL1, OL2, and OL3 of the light emitting units EU-1, EU-2, and EU-3 in the thickness direction, and thus, the size of the light emitting areas PXA-R, PXA-G, and PXA-B may increase.

Figure 14:
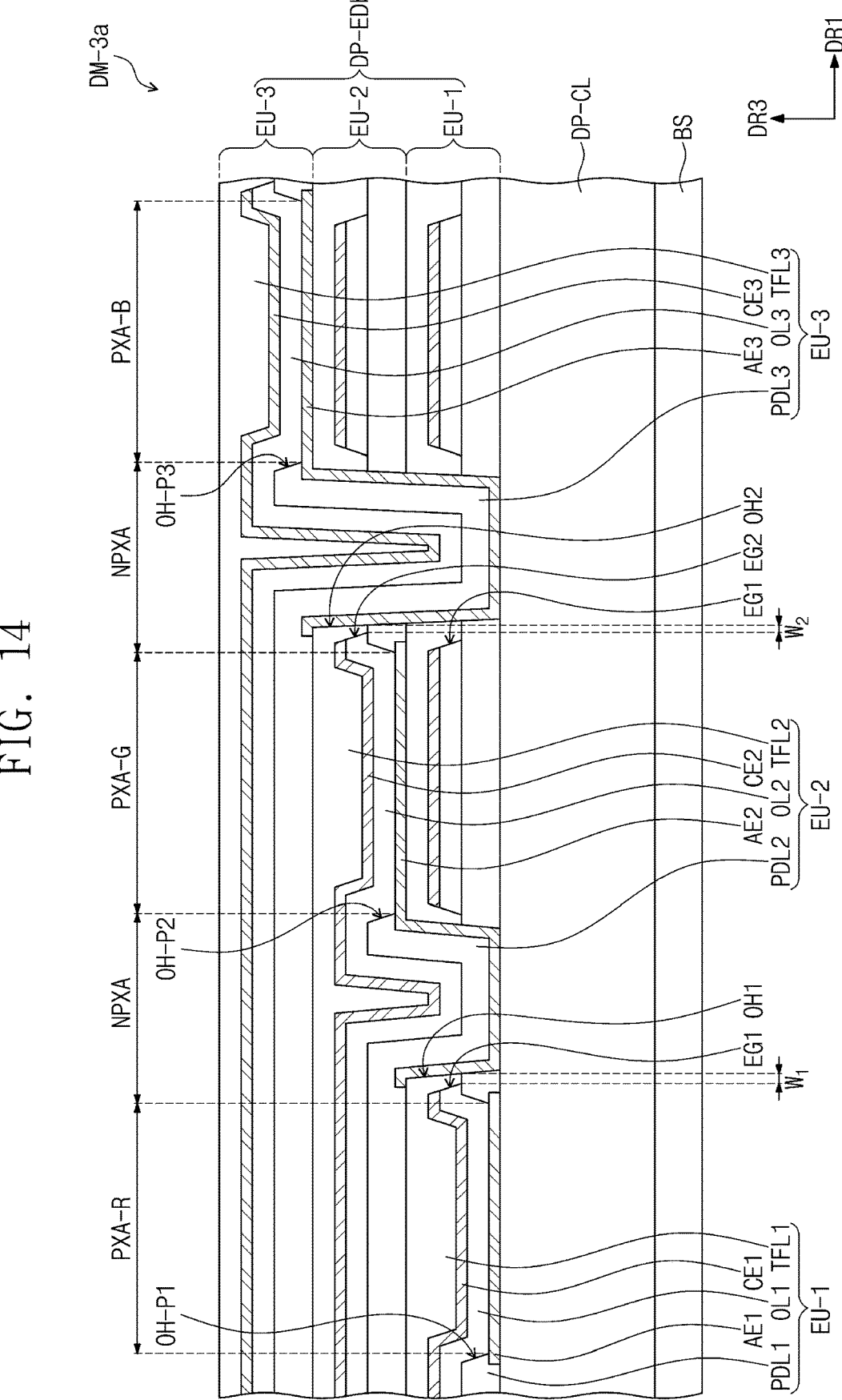
FIG. 14 is a cross-sectional view showing a display module according to an embodiment of the present disclosure.

FIG. 14 is a cross-sectional view showing a display module DM-3a according to an embodiment. The display module DM-3a shown in FIG. 14 has differences in positions of exposed side surfaces EG1 and EG2 of a first functional layer OL1 and a second functional layer OL2 when compared with the display module DM-3 shown in FIG. 13. Meanwhile, FIG. 14 schematically shows a circuit layer DP-CL as a single layer, however, the structure of the circuit layer DP-CL described with reference to FIG. 13 may be applied to the circuit layer DP-CL shown in FIG. 14.

Referring to FIG. 14, different from the embodiment shown in FIG. 13, the exposed side surface EG1 of the first functional layer OL1 may be disposed in a first opening OH1 and may be spaced from a side surface of the first opening OH1. In addition, the exposed side surface EG1 of the first functional layer OL1 and the exposed side surface EG2 of the second functional layer OL2 may be disposed in a second opening OH2 and may be spaced from a side surface of the second opening OH2.

A distance $W_1$ from an exposed side surface of a first encapsulation layer TFL1 defining the first opening OH1 to the exposed side surface EG1 of the first functional layer OL1 may be equal to or greater than about 1 μm. In addition, a distance $W_2$ from an exposed side surface of a second encapsulation layer TFL2 defining the second opening OH2 to the exposed side surface EG2 of the second functional layer OL2 may be equal to or greater than about 1 μm.

In a display element layer DP-EDb of the embodiment shown in FIG. 14, the exposed side surface EG1 of the first functional layer OL1 may be covered by the first encapsulation layer TFL1, and the exposed side surface EG2 of the second functional layer OL2 may be covered by the second encapsulation layer TFL2. Thus, according to the embodiment having the structure shown in FIG. 14, the first functional layer OL1 may be covered by the first encapsulation layer TFL1 in a photolithography process performed after the first light emitting unit EU-1 is manufactured, and thus, elements disposed under the first functional layer OL1 may be protected from external environments.

Figure 15:
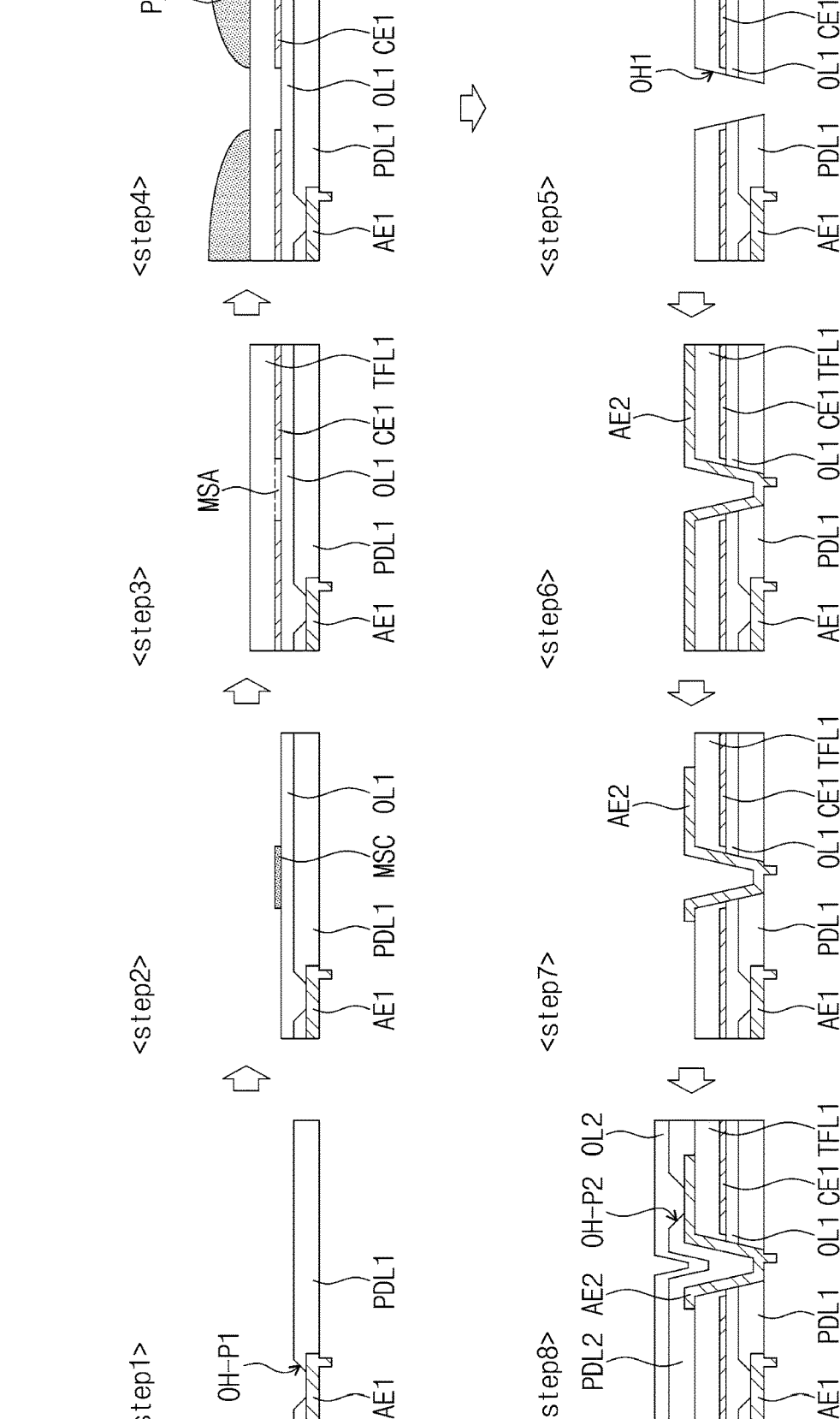
FIG. 15 is a view schematically showing some processes of a method of manufacturing a display device according to an embodiment of the present disclosure.
Figure 16:
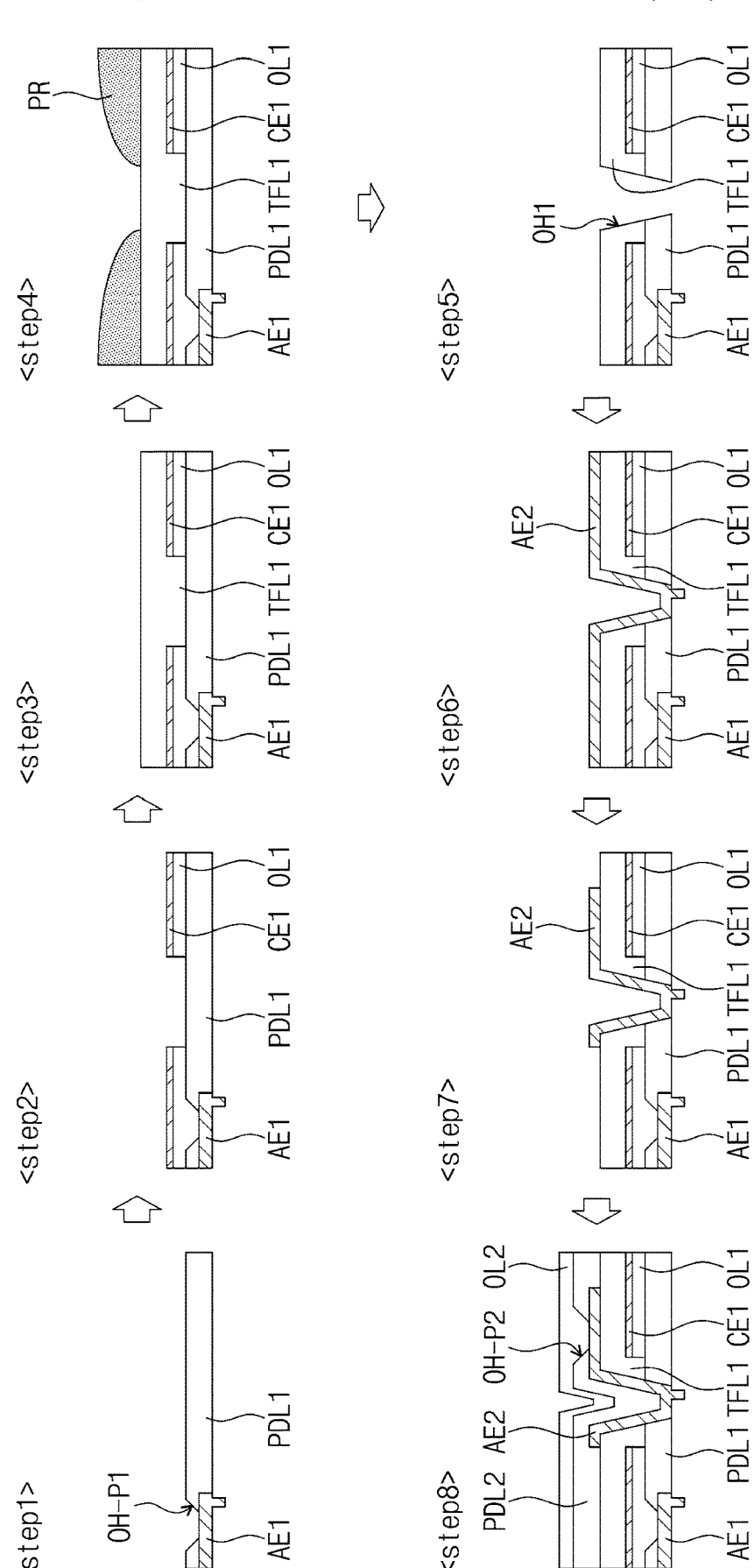
FIG. 16 is a view schematically showing some processes of a method of manufacturing a display device according to an embodiment of the present disclosure.

FIGS. 15 and 16 are views showing some processes of a manufacturing method of the display device according to embodiments. FIG. 15 is a view showing some processes of a manufacturing method of the display module according to the embodiment shown in FIG. 13, and FIG. 16 is a view showing some processes of a manufacturing method of the display module according to the embodiment shown in FIG. 14.

Referring to FIG. 15, a first pixel definition layer PDL1 is provided on a first lower electrode AE1, which is patterned, in a first process (step1). The first pixel opening OH-P1 may be defined through the first pixel definition layer PDL1 to expose an upper surface of the first lower electrode AE1. Then, a first functional layer OL1 may be provided to fill the first pixel opening OH-P1 in a second process (step2). A self-patterning layer MSC may be disposed on the first functional layer OL1 to pattern a first upper electrode CE1. The first upper electrode CE1 may be provided in an area except for a self-patterning area MSA in which the self-patterning layer MSC is disposed in a third process (step3). Then, a first encapsulation layer TFL1 may be disposed on the first upper electrode CE1. The first encapsulation layer TFL1 may be disposed on the first upper electrode CE1 and the self-patterning area MSA (e.g., an entirety of the first upper electrode CE1 and the self-patterning area MSA).

In a fourth process (step4) and a fifth process (step5), a photoresist PR may be provided on the first encapsulation layer TFL1, and a photolithography process may be performed. The first opening OH1 may be defined through the first pixel definition layer PDL1, the first functional layer OL1, and the first encapsulation layer TFL1 by the photolithography process.

In a sixth process (step6) and a seventh process (step7), the second lower electrode AE2 may be provided on the first encapsulation layer TFL1. The second lower electrode AE2 may be provided along portions defining the first opening OH1 and may be patterned to be spaced from the first lower electrode AE1. Then, the second pixel definition layer PDL2 through which the second pixel opening OH-P2 is defined and the second functional layer OL2 may be sequentially provided in an eighth process (step8). In one or more embodiments, the elements of the second light emitting unit EU-2 (e.g., refer to FIG. 10) and the third light emitting unit EU-3 (e.g., refer to FIG. 13) may be sequentially formed using processes of the second process (step2) to the eighth process (step8) shown in FIG. 15.

Referring to FIG. 16, a first pixel definition layer PDL1 is provided on a first lower electrode AE1, which is patterned, in a first process (step1). A first pixel opening OH-P1 may be defined through the first pixel definition layer PDL1 to expose an upper surface of the first lower electrode AE1. Then, the first functional layer OL1 and the first upper electrode CE1 may be provided to fill the first pixel opening OH-P1 and patterned in a second process (step2). That is, there is a difference in that the first functional layer OL1 and the first upper electrode CE1 are patterned before the first encapsulation layer TFL1 is provided when compared with the second process shown in FIG. 15. The first functional layer OL1 and the first upper electrode CE1 may be patterned using the fine metal mask.

In a third process (step3), the first encapsulation layer TFL1 may be disposed on the first upper electrode CE1. The first encapsulation layer TFL1 may be disposed to cover the patterned first upper electrode CE1 and the patterned first functional layer OL1.

In a fourth process (step4) and a fifth process (step5), a photoresist PR may be provided on the first encapsulation layer TFL1, and a photolithography process may be performed. The first opening OH1 may be defined through the first pixel definition layer PDL1 and the first encapsulation layer TFL1 using the photolithography process. That is, according to the embodiment, the first upper electrode CE1 may be formed through two or more patterning processes. As an example, as shown in FIG. 16, the first upper electrode CE1 may be formed through two or more patterning processes performed in the second process (step2), the fourth process (step4), and the fifth process (step5).

Different from the embodiment of FIG. 15, the first functional layer OL1 may be covered and protected by the first encapsulation layer TFL1 in FIG. 16.

In a sixth process (step6) and a seventh process (step7), a second lower electrode AE2 may be provided on the first encapsulation layer TFL1. The second lower electrode AE2 may be provided along portions defining the first opening OH1 and may be patterned to be spaced from the first lower electrode AE1. Then, a second pixel definition layer PDL2 through which the second pixel opening OH-P2 is defined and the second functional layer OL2 may be sequentially provided in an eighth process (step8). In one or more embodiments, the elements of the second light emitting unit EU-2 (e.g., refer to FIG. 11) and the third light emitting unit EU-3 (e.g., refer to FIG. 14) may be sequentially formed using processes of the second process (step2) to the eighth process (step 8) of FIG. 16.

Referring to the display device according to embodiments of the present disclosure, at least one light emitting unit from among the light emitting units emitting the lights in different wavelength regions may be disposed on or at the layer different from the layer on or at which the other light emitting units are disposed in the thickness direction, and thus, the display device may have high resolution. In addition, the display device may include the light emitting units stacked in the thickness direction, and the light emitting layers respectively included in the light emitting units may be disposed on or at different planes from each other. Accordingly, the size of the non-light-emitting area may decrease, and the size of the light emitting area may increase. As a result, the display device may have improved or superior display quality.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present disclosure shall be determined according to the attached claims, and equivalents thereof.

What is claimed is:

1. A display device comprising:
a base layer;
a circuit layer on the base layer; and
a plurality of light emitting units on the circuit layer, each of the light emitting units comprising:
    a lower electrode;
    a pixel definition layer on the lower electrode, the pixel definition layer having a pixel opening to expose the lower electrode;
    a functional layer on the lower electrode, the functional layer comprising a light emitting layer;
    an upper electrode on the functional layer; and
    an encapsulation layer on the upper electrode,
wherein at least one light emitting unit from among the plurality of light emitting units is at a different layer from other light emitting units from among the plurality of light emitting units in a thickness direction,
wherein the pixel openings of the plurality of light emitting units do not overlap each other,
wherein the pixel openings of the plurality of light emitting units are spaced apart from each other in the thickness direction, and
wherein the lower electrode of one of the light emitting units is positioned on a different layer, in the thickness direction, from the lower electrodes of the other light emitting units.

2. The display device of claim 1, wherein the plurality of light emitting units comprises first, second, and third light emitting units configured to emit light in different wavelength regions, and
wherein a light emitting unit from among the first, second, and third light emitting units is at a different layer from other light emitting units from among the first, second, and third light emitting units in the thickness direction.

3. The display device of claim 2, wherein the first light emitting unit is configured to emit red light,
wherein the second light emitting unit is configured to emit green light,
wherein the third light emitting unit is configured to emit blue light, and wherein the first light emitting unit, the second light emitting unit, and the third light emitting unit are sequentially stacked on the circuit layer.

4. The display device of claim 2, wherein the circuit layer comprises first, second, and third transistors on the base layer and spaced from each other, and wherein the first, second, and third light emitting units are electrically connected to the first, second, and third transistors, respectively.

5. The display device of claim 4, wherein the circuit layer further comprises a contact electrode electrically connecting the first, second, and third light emitting units to the first, second, and third transistors, respectively.

6. The display device of claim 2, wherein the display device comprises first, second, and third light emitting areas to emit light in different wavelength regions and a non-light-emitting area between adjacent ones of the first, second, and third light emitting areas, and wherein the pixel openings of the first, second, and third light emitting units correspond to the first, second, and third light emitting areas, respectively.

7. The display device of claim 6, wherein the first light emitting unit comprises:

a first lower electrode;

a first pixel definition layer having a first pixel opening to expose an upper surface of the first lower electrode;

a first functional layer on the first lower electrode;

a first upper electrode on the first functional layer; and a first encapsulation layer on the first upper electrode, wherein the second light emitting unit comprises:

a second lower electrode that does not overlap the first lower electrode;

a second pixel definition layer having a second pixel opening to expose an upper surface of the second lower electrode, the second pixel opening not overlapping the first pixel opening;

a second functional layer on the second lower electrode;

a second upper electrode on the second functional layer; and a second encapsulation layer on the second upper electrode, and wherein the third light emitting unit comprises:

a third lower electrode that does not overlap the first lower electrode and the second lower electrode;

a third pixel definition layer having a third pixel opening to expose an upper surface of the third lower electrode, the third pixel opening not overlapping the first pixel opening and the second pixel opening;

a third functional layer on the third lower electrode;

a third upper electrode on the third functional layer; and a third encapsulation layer on the third upper electrode.

8. The display device of claim 7, wherein the first light emitting unit, the second light emitting unit, and the third light emitting unit are sequentially stacked on the circuit layer, wherein a first opening is defined through the first light emitting unit, wherein a second opening is defined through the first and second light emitting units, wherein the second lower electrode is electrically connected to the circuit layer in the first opening, and wherein the third lower electrode is electrically connected to the circuit layer in the second opening.

9. The display device of claim 7, wherein the first light emitting unit, the second light emitting unit, and the third light emitting unit are sequentially stacked on the circuit layer, wherein a first opening is defined through the first light emitting unit in an area corresponding to a first non-light-emitting area between the first light emitting area and the second light emitting area, and wherein a second opening is defined through the first and second light emitting unit in an area corresponding to a second non-light-emitting area between the second light emitting area and the third light emitting area.

10. The display device of claim 9, wherein the second lower electrode, the second pixel definition layer, the second functional layer, the second upper electrode, and the second encapsulation layer extend to the first opening and are in the first opening, and wherein the third lower electrode, the third pixel definition layer, the third functional layer, the third upper electrode, and the third encapsulation layer extend to the second opening and are in the second opening.

11. The display device of claim 9, wherein an exposed side surface of the first functional layer is spaced from a side surface of the first opening, and wherein the exposed side surface of the first functional layer and an exposed side surface of the second functional layer are spaced from a side surface of the second opening.

12. The display device of claim 11, wherein the exposed side surface of the first functional layer is covered by the first encapsulation layer, and wherein the exposed side surface of the second functional layer is covered by the second encapsulation layer.

13. The display device of claim 7, wherein the first functional layer does not overlap the second functional layer, and wherein the third functional layer overlaps the first functional layer and the second functional layer.

14. The display device of claim 7, wherein the first functional layer does not overlap the third functional layer, and wherein the second functional layer overlaps the first functional layer and the third functional layer.

15. The display device of claim 1, wherein the pixel definition layer of the other light emitting units, except a light emitting unit disposed at a lowermost position among the light emitting units, comprises at least one of silicon oxide and silicon nitride.

16. The display device of claim 1, wherein the encapsulation layer comprises at least one inorganic layer.

17. The display device of claim 1, wherein the encapsulation layer comprises a first inorganic layer, an organic layer, and a second inorganic layer, which are sequentially stacked.

18. A display device comprising:

a base layer;

a circuit layer on the base layer; and first, second, and third light emitting units on the circuit layer, the first light emitting unit comprises:

a first lower electrode;

a first pixel definition layer having a first pixel opening to expose the first lower electrode;

a first functional layer on the first pixel definition layer;

a first upper electrode on the first functional layer; and a first encapsulation layer on the first upper electrode, the second light emitting unit comprises:

a second lower electrode on the first encapsulation layer;

a second pixel definition layer on the second lower electrode, the second pixel definition layer having a second pixel opening to expose the second lower electrode, the second pixel opening not overlapping the first pixel opening;

a second functional layer on the second pixel definition layer;

a second upper electrode on the second functional layer; and a second encapsulation layer on the second upper electrode, and the third light emitting unit comprises:

a third lower electrode on the second encapsulation layer;

a third pixel definition layer on the third lower electrode, the third pixel definition layer having a third pixel opening to expose the third lower electrode, the third pixel opening not overlapping the first pixel opening and the second pixel opening;

a third functional layer on the third pixel definition layer;

a third upper electrode on the third functional layer; and a third encapsulation layer on the third upper electrode, wherein the first pixel opening is spaced apart from the second pixel opening in a thickness direction.

19. The display device of claim 18, wherein the circuit layer comprises first, second, and third transistors configured to be independently driven, and wherein the first, second, and third transistors are electrically connected to the first, second, and third light emitting units, respectively.

20. The display device of claim 18, wherein a first opening is defined through the first light emitting unit, the first opening not overlapping the first pixel opening, wherein the second lower electrode is electrically connected to the circuit layer in the first opening, wherein a second opening is defined through the first and second light emitting units, the second opening not overlapping the first pixel opening, the second pixel opening, and the first opening, and wherein the third lower electrode is electrically connected to the circuit layer in the second opening.

21. The display device of claim 18, wherein the second pixel definition layer and the third pixel definition layer comprise at least one of silicon oxide and silicon nitride.

22. The display device of claim 18, wherein each of the first lower electrode, the second lower electrode, and the third lower electrode is a reflective electrode, and wherein each of the first upper electrode, the second upper electrode, and the third upper electrode is a transmissive electrode.

23. A display device comprising first, second, and third light emitting areas to emit light in different wavelength regions from each other in a plan view, the display device comprising:

a base layer;

a circuit layer on the base layer; and first, second, and third light emitting units on the circuit layer, each of the first, second, and third light emitting units comprising:

a lower electrode;

a pixel definition layer having pixel openings respectively corresponding to the first, second, and third light emitting areas, the pixel openings exposing an upper surface of the lower electrode;

a functional layer on the lower electrode, the functional layer comprising a light emitting layer;

an upper electrode on the functional layer; and an encapsulation layer on the upper electrode, wherein at least one functional layer from among the functional layers of the first, second, and third light emitting units is at a different layer and spaced apart from other functional layers of the first, second, and third light emitting units in a thickness direction, and wherein at least one functional layer from among the functional layers of the first, second, and third light emitting units overlaps at least one other functional layer from among the functional layers of the first, second, and third light emitting units in the thickness direction.

24. The display device of claim 23, wherein the first light emitting unit is configured to emit red light, wherein the second light emitting unit is configured to emit green light, wherein the third light emitting unit is configured to emit blue light, wherein the first light emitting unit is on the circuit layer, wherein the second light emitting unit is on the first light emitting unit, and wherein the third light emitting unit is on the second light emitting unit.

* * * * *